(12) United States Patent
Hayakawa et al.

(10) Patent No.: US 11,957,071 B2
(45) Date of Patent: Apr. 9, 2024

(54) VERTICAL VARIABLE RESISTANCE MEMORY DEVICES AND METHODS OF OPERATION IN THE SAME

(71) Applicant: SAMSUNG ELECTRONICS CO., LTD., Suwon-si (KR)

(72) Inventors: Yukio Hayakawa, Seongnam-si (KR); Jooheon Kang, Suwon-si (KR); Myunghun Woo, Hwaseong-si (KR); Gunwook Yoon, Suwon-si (KR); Doohee Hwang, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 144 days.

(21) Appl. No.: 17/749,289

(22) Filed: May 20, 2022

(65) Prior Publication Data
US 2022/0278273 A1  Sep. 1, 2022

Related U.S. Application Data

(62) Division of application No. 17/039,146, filed on Sep. 30, 2020, now Pat. No. 11,398,598.

(30) Foreign Application Priority Data

Feb. 24, 2020  (KR) .................. 10-2020-0022105

(51) Int. Cl.
*G11C 13/00* (2006.01)
*H10B 63/00* (2023.01)
*H10N 70/00* (2023.01)

(52) U.S. Cl.
CPC ....... *H10N 70/826* (2023.02); *G11C 13/0026* (2013.01); *G11C 13/0028* (2013.01);
(Continued)

(58) Field of Classification Search
CPC ........... G11C 13/0069; G11C 13/0026; G11C 13/0028; G11C 13/0038; G11C 13/0004;
(Continued)

(56) References Cited

U.S. PATENT DOCUMENTS 8,502,184 B2   8/2013 An et al.
8,664,633 B2   3/2014 Park et al.
(Continued)

FOREIGN PATENT DOCUMENTS

KR   10-1328261   11/2013

OTHER PUBLICATIONS

Notice of Allowance dated Mar. 23, 2022 In Corresponding U.S. Appl. No. 17/039,146.

*Primary Examiner* — Ajay Ojha
(74) *Attorney, Agent, or Firm* — F. Chau & Associates, LLC

(57) ABSTRACT

A vertical variable resistance memory device includes gate electrodes and a pillar structure. The gate electrodes are spaced apart from one another on a substrate in a vertical direction substantially perpendicular to an upper surface of the substrate. The pillar structure extends in the vertical direction through the gate electrodes on the substrate. The pillar structure includes a vertical gate electrode extending in the vertical direction, a variable resistance pattern disposed on a sidewall of the vertical gate electrode, and a channel disposed on an outer sidewall of the variable resistance pattern. The channel and the vertical gate electrode contact each other.

15 Claims, 22 Drawing Sheets

(52) U.S. Cl.
CPC ...... *G11C 13/0038* (2013.01); *G11C 13/0069* (2013.01); *H10B 63/34* (2023.02); *H10N 70/841* (2023.02); *H10N 70/8833* (2023.02)

(58) Field of Classification Search
CPC ............... H10N 70/826; H10N 70/841; H10N 70/8833; H10N 70/231; H10N 70/823; H10N 70/883; H10N 70/253; H10N 70/821
See application file for complete search history.

(56) References Cited

U.S. PATENT DOCUMENTS

| | | |
|---|---|---|
| 9,093,369 B2 | 7/2015 | Shin et al. |
| 9,159,768 B2 | 10/2015 | Joo et al. |
| 9,184,216 B2 | 11/2015 | Park |
| 9,196,657 B2 | 11/2015 | Cho |
| 9,373,396 B2 | 6/2016 | Ratnam et al. |
| 9,419,217 B2 | 8/2016 | Vereen et al. |
| 9,666,642 B2 | 5/2017 | Park |
| 9,685,484 B1 | 6/2017 | Rabkin et al. |
| 10,109,680 B1 | 10/2018 | Wicklein et al. |
| 10,115,897 B1 | 10/2018 | Sato |
| 10,249,682 B2 | 4/2019 | Franca-Neto et al. |
| 10,283,706 B2 | 5/2019 | Ishikawa et al. |
| 10,396,280 B2 | 8/2019 | Mori et al. |
| 2013/0200331 A1 | 8/2013 | Morikawa et al. |
| 2017/0271403 A1 | 9/2017 | Yamamoto et al. |
| 2018/0277757 A1 | 9/2018 | Mori et al. |
| 2019/0088318 A1 | 3/2019 | Morooka |
| 2019/0088716 A1 | 3/2019 | Suzuki et al. |
| 2019/0348465 A1 | 11/2019 | Ando et al. |
| 2021/0265565 A1 | 8/2021 | Hayakawa et al. |

VERTICAL VARIABLE RESISTANCE MEMORY DEVICES AND METHODS OF OPERATION IN THE SAME

CROSS-REFERENCE TO RELATED APPLICATIONS

This application is a divisional application of U.S. patent application Ser. No. 17/039,146 filed Sep. 30, 2020, which claims priority under 35 U.S.C. § 119 to Korean Patent Application No. 10-2020-0022105, filed on Feb. 24, 2020 in the Korean Intellectual Property Office (KIPO), the disclosures of which are incorporated by reference herein in their entirety.

TECHNICAL FIELD

Exemplary embodiments of the inventive concept relate to a vertical variable resistance memory device and a method of operation in the same.

DISCUSSION OF THE RELATED ART

In a variable resistance memory device, a current for a set operation and a reset operation of a memory cell and a read current for determining the memory cell typically have the same flow direction. Thus, to prevent the interference of the set and reset states by the read current, the set current and the reset current may be set to be greater than the read current, which may deteriorate the endurance of the memory cell and increase power consumption.

SUMMARY

Exemplary embodiments provide a vertical variable resistance memory device having improved characteristics.

Exemplary embodiments provide a method of operation in a vertical variable resistance memory device having improved characteristics.

According to an aspect of the inventive concept, there is provided a vertical variable resistance memory device. The vertical variable resistance memory device may include gate electrodes and a pillar structure. The gate electrodes may be spaced apart from one another on a substrate in a vertical direction substantially perpendicular to an upper surface of the substrate. The pillar structure may extend in the vertical direction through the gate electrodes on the substrate. The pillar structure may include a vertical gate electrode extending in the vertical direction, a variable resistance pattern on a sidewall of the vertical gate electrode, and a channel on an outer sidewall of the variable resistance pattern. The channel and the vertical gate electrode may contact each other.

According to an aspect of the inventive concept, there is provided a vertical variable resistance memory device. The vertical variable resistance memory device may include a common source line (CSL), a bit line, and a memory cell. The CSL may extend on a substrate in a first direction substantially parallel to an upper surface of the substrate. The bit line may extend on the substrate in a second direction substantially parallel to the upper surface of the substrate and crossing the first direction. The memory cell may be electrically connected to the CSL and the bit line, and may include a first gate electrode, a second gate electrode facing the first gate electrode in a horizontal direction substantially parallel to the upper surface of the substrate, and a channel and a variable resistance pattern sequentially stacked in the horizontal direction between the first and second gate electrodes.

According to an aspect of the inventive concept, there is provided a vertical variable resistance memory device. The vertical variable resistance memory device may include a common source line (CSL), a channel connection pattern, a support layer, gate electrodes, pillar structures, and a bit line. The CSL may extend on a substrate in a first direction substantially parallel to an upper surface of the substrate. The channel connection pattern may be formed on the substrate to be electrically connected to the CSL. The support layer may be formed on the channel connection pattern. The gate electrodes may be spaced apart from one another on the support layer in a second direction substantially perpendicular to the upper surface of the substrate. The pillar structures may be formed on the substrate, and each of the pillar structures may extend in the second direction through the gate electrodes, the support layer and the channel connection pattern. The bit line may extend on the pillar structures in a third direction substantially parallel to the upper surface of the substrate and crossing the second direction. Each of the pillar structures may include a vertical gate electrode extending in the second direction, a variable resistance pattern on a sidewall of the vertical gate electrode, a channel on an outer sidewall of the variable resistance pattern, and an insulation pattern on an outer sidewall of the channel. The channel and the vertical gate electrode may contact each other.

According to an aspect of the inventive concept, there is provided a method of performing a reset operation in a vertical variable resistance memory device including a cell string having memory cells disposed in series between a common source line (CSL) and a bit line (BL). The cell string may include word lines spaced apart from one another in a vertical direction, a vertical gate electrode extending in the vertical direction through the word lines and being insulated therefrom, and a channel and a variable resistance pattern, each of which may extend in the vertical direction, between the vertical gate electrode and the word lines. The vertical gate electrode and an upper end portion of the channel may contact each other to be electrically connected to the BL, and a lower end portion of the channel may be electrically connected to the CSL. Each of the memory cells may include each of the word lines, a portion of the vertical gate electrode facing a corresponding one of the word lines in a horizontal direction, and portions of the channel and the variable resistance pattern between each of the word lines and the portion of the vertical gate electrode facing each other in the horizontal direction. In the method, a third reset voltage may be applied to a selected word line among the word lines and 0 V may be applied to the vertical gate electrode to form a depletion region at a portion of the channel of a selected memory cell including the selected word line among the memory cells. A first reset voltage may be applied to the vertical gate electrode with maintaining the selected word line at the third reset voltage, so that the depletion region may remain at the portion of the channel of the selected memory cell and oxygen vacancies distributed in a portion of the variable resistance pattern of the selected memory cell may move in the horizontal direction to a portion of the variable resistance pattern distal to the channel. A second reset voltage may be applied to the selected word line with the vertical gate electrode at the first reset voltage, so that the oxygen vacancies distributed in the portion of the variable resistance pattern distal to the channel may be arranged in the vertical direction and that the selected memory cell may be reset.

According to an aspect of the inventive concept, there is provided a method of performing a set operation in a vertical variable resistance memory device including a cell string having memory cells disposed in series between a common source line (CSL) and a bit line (BL). The cell string may include word lines spaced apart from one another in a vertical direction, a vertical gate electrode extending in the vertical direction through the word lines and being insulated therefrom, and a channel and a variable resistance pattern, each of which may extend in the vertical direction, between the vertical gate electrode and the word lines. The vertical gate electrode and an upper end portion of the channel may contact each other to be electrically connected to the BL, and a lower end portion of the channel may be electrically connected to the CSL. Each of the memory cells may include each of the word lines, a portion of the vertical gate electrode facing a corresponding one of the word lines in a horizontal direction, and portions of the channel and the variable resistance pattern between each of the word lines and the portion of the vertical gate electrode facing each other in the horizontal direction. In the method, a third set voltage may be applied to a selected word line among the word lines and 0 V may be applied to the vertical gate electrode to form a depletion region at a portion of the channel of a selected memory cell including the selected word line among the memory cells. First and second set voltages may be applied to the vertical gate electrode and the selected word line, respectively, so that oxygen vacancies distributed in a portion of the variable resistance pattern of the selected memory cell may move in the horizontal direction to a portion of the variable resistance pattern proximate to the channel to be arranged in the vertical direction.

According to an aspect of the inventive concept, there is provided a method of operation in a vertical variable resistance memory device including a cell string having memory cells disposed in series between a common source line (CSL) and a bit line (BL). The cell string may include word lines spaced apart from one another in a vertical direction, a vertical gate electrode extending in the vertical direction through the word lines and being insulated therefrom, and a channel and a variable resistance pattern, each of which may extend in the vertical direction, between the vertical gate electrode and the word lines. The vertical gate electrode and an upper end portion of the channel may contact each other to be electrically connected to the BL, and a lower end portion of the channel may be electrically connected to the CSL. Each of the memory cells may include each of the word lines, a portion of the vertical gate electrode facing a corresponding one of the word lines in a horizontal direction, and portions of the channel and the variable resistance pattern between each of the word lines and the portion of the vertical gate electrode facing each other in the horizontal direction. In the method, 0 V may be applied to both the CSL and the BL, and a second read voltage and 0 V may be applied to a selected word line and unselected word line, respectively, among the word lines, so as to form a depletion region at a portion of the channel of a selected memory cell including the selected word line among the memory cells. With the BL and the selected word line being maintained at 0 V and the second read voltage, respectively, a turn-on voltage may be applied to the unselected word line to form an inversion layer at a portion of the channel of an unselected memory cell including the unselected word line, and a first read voltage may be applied to the CSL so that a read current may flow in the vertical direction through the portion of the channel of the unselected memory cell where the inversion layer is formed and a portion of the variable resistance pattern of the selected memory cell and that the selected memory cell may be read.

According to an aspect of the inventive concept, there is provided a method of operation in a vertical variable resistance memory device having memory cells disposed in a vertical direction. Each of the memory cells may include a word line, a vertical gate electrode facing the word line in a horizontal direction, and a channel and a variable resistance pattern between the word line and the vertical gate electrode facing each other. In the method, oxygen vacancies in the variable resistance pattern included in a selected memory cell among the memory cells may be moved in the horizontal direction to a portion of the variable resistance pattern proximate or distal to the channel so that the selected memory cell may be set or reset, respectively. The oxygen vacancies may be moved due to an electric field in the horizontal direction generated by an electric potential difference between the word line included in the selected memory cell and the vertical gate electrode. A state of the selected memory cell may be determined by flowing a read current in the vertical direction through the variable resistance pattern included in the selected memory cell, the state including a set state and a reset state.

In the vertical variable resistance memory device in accordance with exemplary embodiments, deterioration of endurance of memory cells due to a high operation current and high power consumption may be prevented or reduced.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
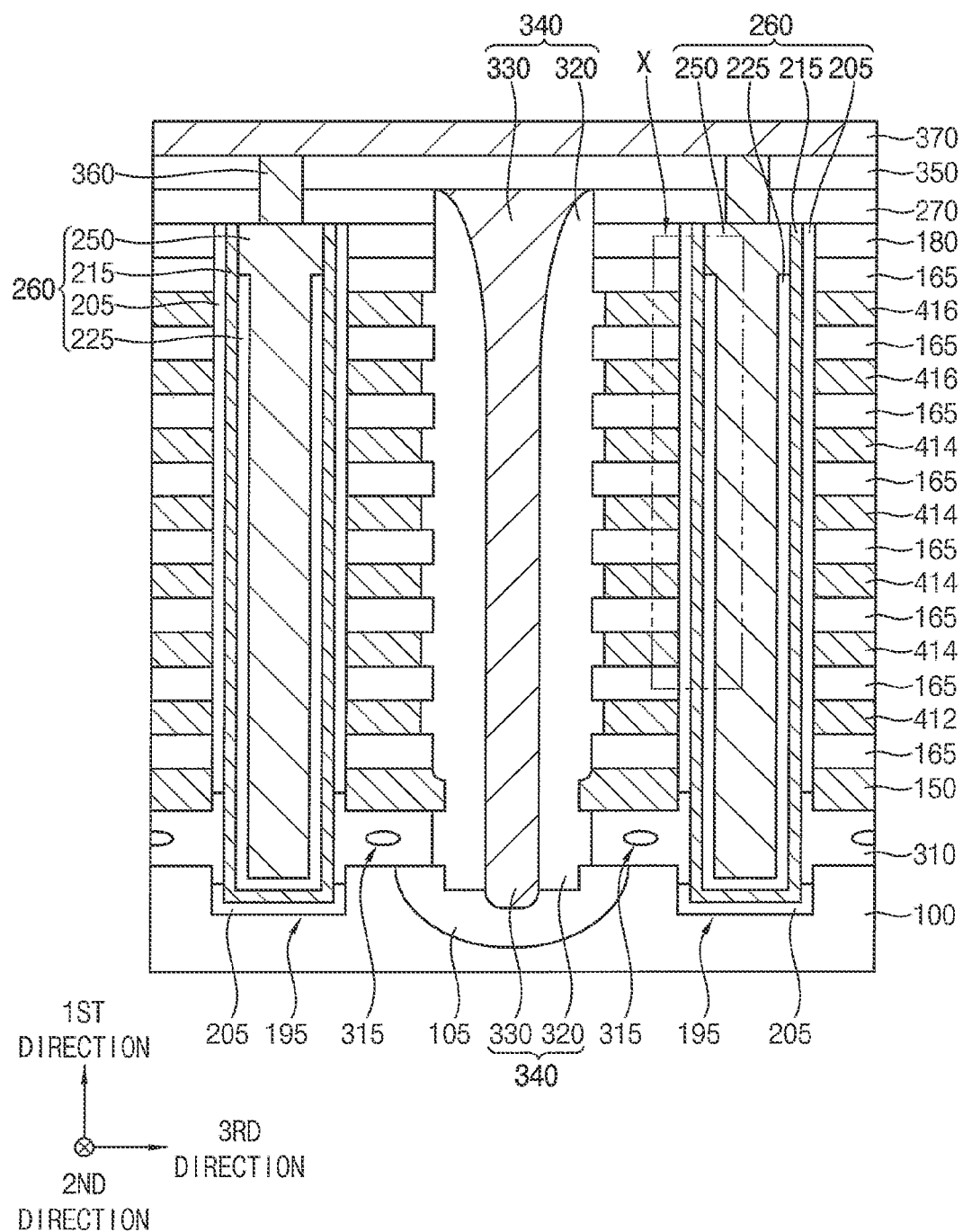
FIG. 1 is a cross-sectional view illustrating a vertical variable resistance memory device in accordance with exemplary embodiments.

Exemplary embodiments of the present inventive concept will be described more fully hereinafter with reference to the accompanying drawings. Like reference numerals may refer to like elements throughout the accompanying drawings.

Hereinafter, a direction substantially perpendicular to an upper surface of a substrate may be defined as a first direction, and two directions substantially parallel to the upper surface of the substrate and crossing each other may be defined as second and third directions, respectively. In exemplary embodiments, the second and third directions may be substantially perpendicular to each other.

When two directions are described as being substantially parallel or substantially perpendicular to each other, it is to be understood that the two directions are exactly parallel or perpendicular to each other, or are approximately parallel or perpendicular to each other within a measurement error as would be understood by a person having ordinary skill in the art.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

FIG. 1 is a cross-sectional view illustrating a vertical variable resistance memory device in accordance with exemplary embodiments.

Referring to FIG. 1, the vertical variable resistance memory device may include a common source line (CSL) 105, a gate electrode structure, a pillar structure 260, a division structure 340, a contact plug 360 and a bit line (BL) 370 disposed on a substrate 100. The vertical variable resistance memory device may further include a channel connection pattern 310, a support layer 150, a support pattern, a first insulation pattern 165, first to third insulating interlayers 180, 270 and 350, and a fourth insulating interlayer.

The substrate 100 may include, for example, silicon, germanium, silicon-germanium or a III-V compound such as GaP, GaAs, GaSb, etc. In exemplary embodiments, the substrate 100 may be a silicon-on-insulator (SOI) substrate or a germanium-on-insulator (GOI) substrate.

The gate electrode structure may include a plurality of gate electrodes 412, 414 and 416 disposed on the substrate 100 and spaced apart from one another in the first direction, each of which may surround the pillar structure 260. The first direction may also be referred to as a vertical direction, which is substantially perpendicular to an upper surface of the substrate 100. The pillar structure 260 may be disposed on the substrate 100 and extend in the first direction through the gate electrodes 412, 414 and 416. Each of the gate electrodes 412, 414 and 416 may extend in the second direction. Lengths in the second direction of the gate electrodes 412, 414 and 416 may decrease from a lowermost one of the gate electrodes 412, 414 and 416 to an uppermost one of the gate electrodes 412, 414 and 416, and thus, the gate electrode structure may have a staircase shape (also referred to as a stepwise shape). Each of the gate electrodes 412, 414 and 416 may be referred to as a horizontal gate electrode in comparison to a vertical gate electrode described below.

The gate electrode structure may include the first to third gate electrodes 412, 414 and 416. The first gate electrode 412 may serve as a ground selection line (GSL), the second gate electrode 414 may serve as a word line, and the third gate electrode 416 may serve as a string selection line (SSL).

Each of the first to third gate electrodes 412, 414 and 416 may be formed at one or more than one levels. In exemplary embodiments, the first gate electrode 412 may be formed at a lowermost level, the third gate electrode 416 may be formed at an uppermost level and one level directly under the uppermost level, and the second gate electrode 414 may be formed at a plurality of levels between the first and third gate electrodes 412 and 416.

Each of the first to third gate electrodes 412, 414 and 416 may include a gate conductive pattern and a gate barrier pattern covering lower and upper surfaces and a sidewall of the gate conductive pattern. The gate conductive pattern may include a low resistance metal such as, e.g., tungsten, titanium, tantalum, platinum, etc., and the gate barrier pattern may include a metal nitride such as, e.g., titanium nitride, tantalum nitride, etc.

The first insulation pattern 165 may be formed between neighboring ones of the gate electrodes 412, 414 and 416, and the gate electrodes 412, 414 and 416 and the first insulation pattern 165 may form the mold having a staircase shape including step layers arranged in the second direction. The first insulation pattern 165 may include an oxide such as, e.g., silicon oxide.

The gate electrode structure may extend in the second direction, and a plurality of gate electrode structures may be arranged in the third direction. The gate electrode structures may be spaced apart from one another by the division structure 340 extending in the second direction.

In an exemplary embodiment, the division structure 340 may include the mold, the channel connection pattern 310, the support layer 150, a common source plug (CSP) 330 extending in the second direction through the first and second insulating interlayers 180 and 270, and a second spacer disposed on each of opposite sidewalls in the third direction of the CSP 330. The CSP may include, for example, a metal, a metal nitride, a metal silicide, etc., and the second spacer 320 may include an oxide such as, e.g., silicon oxide.

In an exemplary embodiment, the CSP 330 does not extend in the second direction, and a plurality of CSPs 330 may be spaced apart from one another in the second direction. In an exemplary embodiment, the CSP 330 is not formed, and the division structure 340 may include only the second spacer 320.

The CSL 105 may be formed at an upper portion of the substrate 100 and may contact a bottom surface of the division structure 340 to be electrically connected to the CSP 330. In exemplary embodiments, the CSL 105 may be an impurity region doped with n-type impurities such as, e.g., phosphorous impurities.

The pillar structure 260 may be formed in a hole 195 extending through the mold, the support layer 150 and the channel connection pattern 310 to expose an upper surface of the substrate 100, and thus may extend in the first direction. The pillar structure 260 may have a shape of, e.g., a circle in a plan view. However, the inventive concept is not limited thereto.

The pillar structure 260 may include a vertical gate electrode 250 extending in the first direction, a variable resistance pattern 225 disposed on a sidewall of the vertical gate electrode 250, a channel 215 disposed on an outer sidewall of the variable resistance pattern 225, and a second insulation pattern 205 sequentially stacked covering a sidewall and a bottom surface of the vertical gate electrode 250. The channel 215 and the vertical gate electrode 250 may contact each other (e.g., may directly contact each other).

In exemplary embodiments, the vertical gate electrode 250 may have a pillar shape, and may include lower and upper portions sequentially stacked. A width of the upper portion of the vertical gate electrode 250 may be greater than a width of the lower portion thereof. The vertical gate electrode 250 may include polysilicon doped with n-type impurities such as, e.g., phosphorous or a metal.

The variable resistance pattern 225 may have a cup-like shape covering a lower sidewall and the bottom surface of the vertical gate electrode 250.

In exemplary embodiments, an electrical path such as, e.g., a filament, may be generated in the variable resistance pattern 225 by a difference between voltages applied to respective opposite ends thereof, and thus, the variable resistance pattern 225 may include a material having a variable resistance that may vary according to the formation of the electrical path. For example, the filament may be generated by an oxygen vacancy due to the movement of oxygen included in the variable resistance pattern 225. A perovskite-based material included in the variable resistance pattern 225 may include, e.g., STO ($SrTiO_3$), BTO ($BaTiO_3$), PCMO ($Pr_{1-x}Ca_xMnO_3$), etc. A transition metal oxide (TMO) included in the variable resistance pattern 225 may include, e.g., titanium oxide ($TiO_x$), zirconium oxide ($ZrO_x$), aluminum oxide ($AlO_x$), hafnium oxide ($HfO_x$), etc. These may be used alone or in a combination thereof.

In exemplary embodiments, the variable resistance pattern 225 may include a single layer or a composite layer having a plurality of single layers sequentially stacked.

The channel 215 may have a cup-like shape covering an outer sidewall and a bottom surface of the variable resistance pattern 225 and an upper sidewall of the vertical gate electrode 250. For example, in a cross-sectional view, as shown in FIG. 1, the cup-like shape of the channel 215 may include a bottom surface connected to two side surfaces, which oppose each other, and may be open at a top area opposing the bottom surface. Thus, the channel 215 may contact the vertical gate electrode 250 to be electrically connected thereto. For example, the channel 215 may contact (e.g., directly contact) the upper sidewall of the vertical gate electrode 250. That is, among the upper sidewall of the vertical gate electrode 250 and the lower sidewall of the vertical gate electrode 250, in which the upper sidewall corresponds to the upper portion of the vertical gate electrode 250 and the lower sidewall corresponds to the lower portion of the vertical gate electrode, in which the upper portion has a greater width than the lower portion, the channel 215 may contact (e.g., directly contact) the upper sidewall. The variable resistance pattern 225 may cover the lower sidewall of the vertical gate electrode 250. The outer sidewall of the variable resistance pattern 225 may be aligned with the sidewall of the vertical gate electrode 250 in the first direction. A plurality of channels 215 may be formed in the second and third directions to define a channel array. For example, the plurality of channels 215 may be spaced apart from one another in the third direction, which may also be referred to as a horizontal direction extending substantially parallel to the upper surface of the substrate 100. The channel 215 may include, e.g., undoped polysilicon.

An interface layer such as an oxide layer, for example, a silicon oxide layer including oxygen or a silicon nitride layer including nitrogen, may be formed between the channel 215 and the variable resistance pattern 225. In an exemplary embodiment, the interface layer may include at least one of oxygen and nitrogen, and may be formed between the channel 215 and the variable resistance pattern 225.

The second insulation pattern 205 may include an upper portion covering most of a portion of an outer sidewall of the channel 215, and a lower portion covering a bottom surface of the channel 215 on the substrate 100. For example, the upper portion of the second insulation pattern 205 may cover a majority of the outer sidewall of the channel 215. The lower and upper portions of the second insulation pattern 205 may be spaced apart from each other in the first direction, and thus, in an exemplary embodiment, a lower portion of the channel 215 is not covered by the second insulation pattern 205. For example, the outer sidewall of the channel 215 at a lower portion of the channel 215 is not covered by the second insulation pattern 205 in an exemplary embodiment, as shown in FIG. 1. In an exemplary embodiment, the second insulation pattern 205 may partially cover the outer sidewall of the channel 215 and may contact (e.g., directly contact) each of the gate electrodes 412, 414 and 416. The second insulation pattern 205 may include an oxide such as, e.g., silicon oxide.

The channel connection pattern 310 may be formed under the first gate electrode 412 on the substrate 100, and may contact a lower outer sidewall of each of the channels 215, that is, a portion of an outer sidewall of each of the channels 215 between the lower and upper portions of the second insulation pattern 205, which is not covered by the second insulation pattern 205 in an exemplary embodiment. Thus, the channels 215 included in the channel array may be electrically connected to each other. The channel connection pattern 310 may include polysilicon doped with, e.g., n-type impurities, and may have an air gap 315 therein. Each of the channels 215 may be electrically connected to the CSL 105 on the substrate 100 and the CSP 330 contacting the CSL 105 through the channel connection pattern 310. The CSL 105 may be electrically connected to the channel connection pattern 310.

The support layer 150 may be formed between the channel connection pattern 310 and the first gate electrode 412. However, a portion of the support layer 150 may extend through the channel connection pattern 310 to contact an upper surface of the substrate 100, which may be referred to as a support pattern. A plurality of support patterns may be arranged in the second and third directions, and may have various layouts. Some of the support patterns may extend in the second direction or third direction.

The contact plug 360 may extend through the second and third insulating interlayers 270 and 350 to contact an upper surface of the vertical gate electrode 250.

The bit line 370 may extend through the fourth insulating interlayer in the third direction, and a plurality of bit lines 370 may be spaced apart from one another in the second direction. Each of the bit lines 370 may commonly contact upper surfaces of the contact plugs 360 disposed in the third direction. Thus, the bit line 370 may be electrically connected to the vertical gate electrode 250 through the contact plug 360, and may further be electrically connected to the channel 215 connected to the vertical gate electrode 250.

The first insulating interlayer 180 may be formed on the support layer 150 to cover the mold, and the second and third insulating interlayers 270 and 350 and the fourth insulating interlayer may be sequentially stacked on the first insulating interlayer 180. The first to third insulating interlayers 180, 270 and 350 and the fourth insulating interlayer may include an oxide such as, e.g., silicon oxide, and may be merged with one another. For example, in an exemplary embodiment, the first to third insulating interlayers 180, 270 and 350 and the fourth insulating interlayer may be integrally formed.

As illustrated above, the vertical variable resistance memory device may include the vertical gate electrode 250 extending in the first direction, the lower sidewall and the bottom surface of the vertical gate electrode 250 may be covered by the variable resistance pattern 225, and the upper sidewall of the vertical gate electrode 250 may be connected to the upper outer sidewall of the channel 215 (e.g., the upper sidewall of the vertical gate electrode 250 may be in direct contact with the upper outer sidewall of the channel 215). Thus, a memory cell may include a portion of the vertical gate electrode 250 facing each of the second gate electrodes 414 in a horizontal direction, in addition to each of the second gate electrodes 414, and portions of the second insulation pattern 205, the channel 215 and the variable resistance pattern 225 facing each of the second gate electrodes 414 in the horizontal direction.

The second gate electrodes 414 may be spaced apart from one another in the first direction, and the pillar structure 260 including the second insulation pattern 205, the channel 215, the variable resistance pattern 225 and the vertical gate electrode 250 may extend in the first direction. Thus, a plurality of memory cells, each electrically connected to the CSL 105 and the bit line 370 and including, for example, the gate electrodes 412, 414 and 416, the channel 215, and the variable resistance pattern 225, may be formed in the first direction to form a cell string. Additionally, each of the second gate electrodes 414 may extend in the second direction, and a plurality of pillar structures 260 each extending through the second gate electrodes 414 may be spaced apart from one another in the second and third directions. Thus, a plurality of memory cells may be formed in the second and third directions.

In exemplary embodiments, each memory cell of the vertical variable resistance memory device may include the variable resistance pattern 225, however, the layout of the memory cells may be the same as a vertical NAND flash memory device. That is, the vertical variable resistance memory device may be a Re-VNAND memory device having the structure of the VNAND flash memory device, but including the variable resistance pattern 225 instead of a charge storage structure. Thus, each memory cell may include the variable resistance pattern 225 instead of the charge storage structure, and thus, problems relating to the coupling between vertically stacked memory cells in the VNAND flash memory device may not occur.

Additionally, in exemplary embodiments, each memory cell may operate properly without utilizing a high current during operation. As a result, the endurance of memory cells may be improved, and a low power memory device may be implemented. Further detail regarding the operation method and effect of the vertical variable resistance memory device according to exemplary embodiments will be described below.

FIGS. 2 to 9 are cross-sectional views illustrating a method of manufacturing a vertical variable resistance memory device in accordance with exemplary embodiments.

Figure 2:
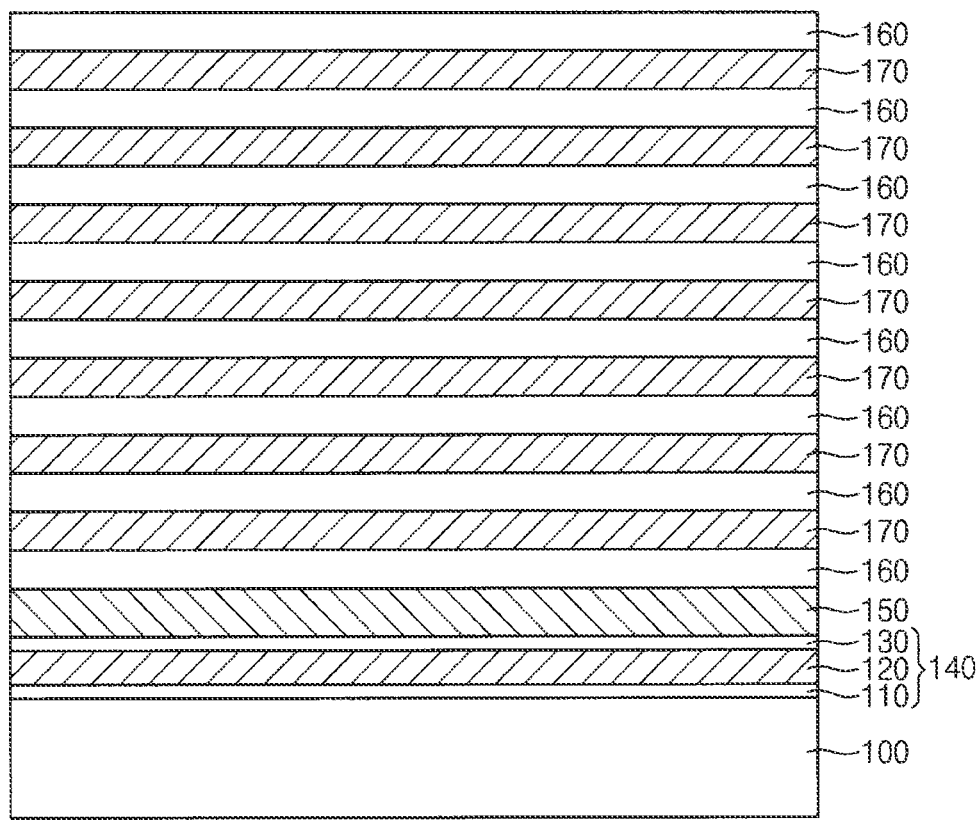
FIGS. 2 to 9 are cross-sectional views illustrating a method of manufacturing a vertical variable resistance memory device in accordance with exemplary embodiments.
Figure 2:
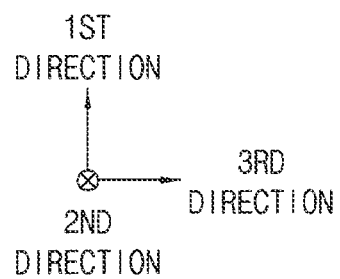

Referring to FIG. 2, a sacrificial layer structure 140 and a support layer 150 may be formed on a substrate 100, and a first insulation layer 160 and a fourth sacrificial layer 170 may be alternately and repeatedly stacked on the support layer 150 to form a mold layer.

The sacrificial layer structure 140 may include first to third sacrificial layers 110, 120 and 130 sequentially stacked in the first direction. Each of the first and third sacrificial layers 110 and 130 may include an oxide such as, e.g., silicon oxide, and the second sacrificial layer 120 may include a nitride such as, e.g., silicon nitride.

The support layer 150 may include a material having an etching selectivity with respect to the first to third sacrificial layers 110, 120 and 130 such as, e.g., polysilicon doped with n-type impurities.

In exemplary embodiments, the sacrificial layer structure 140 may be partially removed to form a first opening exposing an upper surface of the substrate 100 before forming the first insulation layer 160, and the support layer 150 may be formed on the substrate 100 and the sacrificial layer structure 140 to at least partially fill the first opening. Thus, a support pattern may be formed in the first opening.

The first insulation layer 160 may include an oxide such as, e.g., silicon oxide, and the fourth sacrificial layer 170 may include a material having an etching selectivity with respect to the first insulation layer 160 such as, e.g., a nitride such as silicon nitride.

Figure 3:
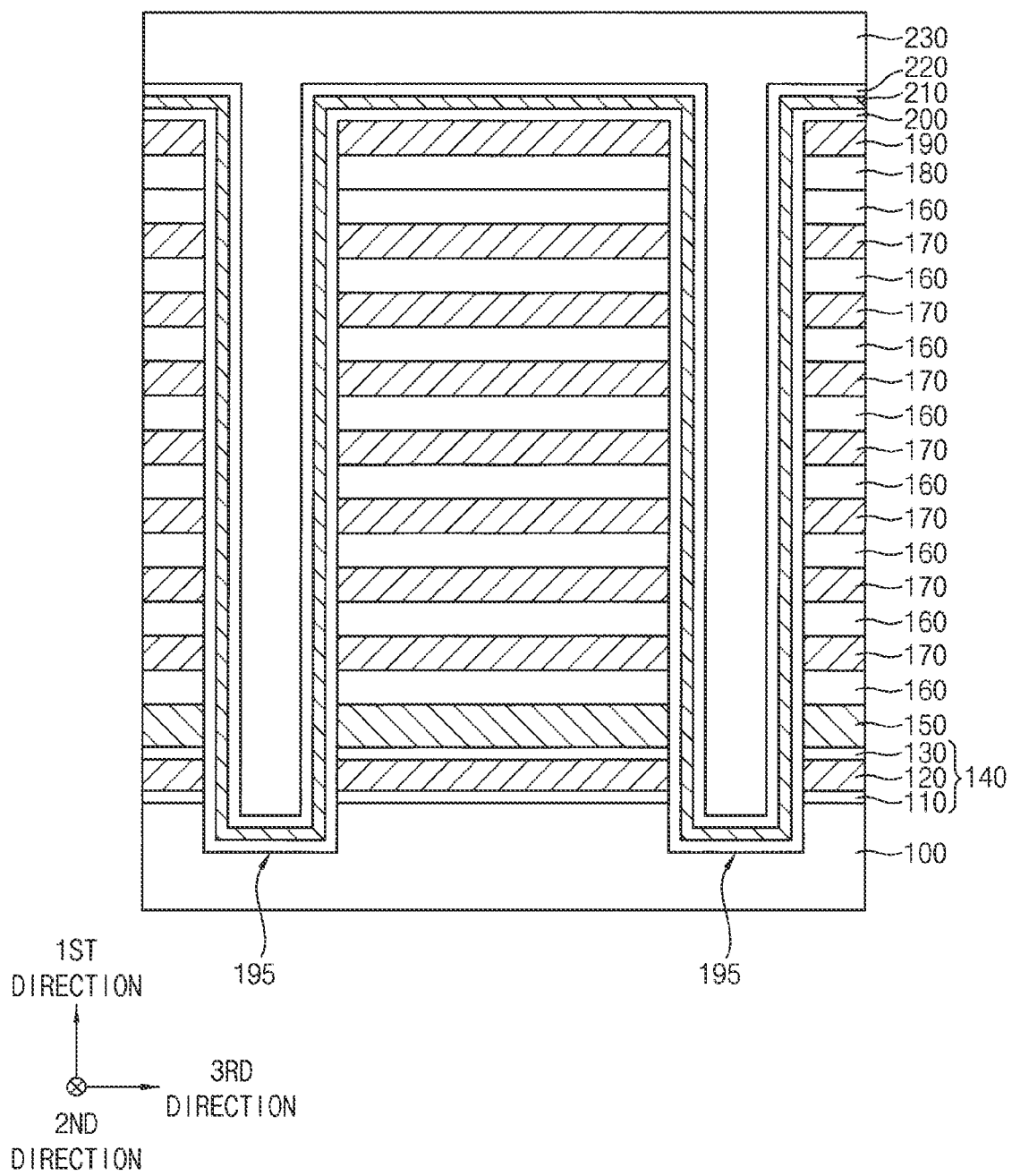

Referring to FIG. 3, a photoresist pattern partially covering an uppermost one of the first insulation layers 160 may be formed on the uppermost one of the first insulation layers 160, and the uppermost one of the first insulation layers 160 and an uppermost one of the fourth sacrificial layers 170 may be etched using the photoresist pattern as an etching mask. Thus, one of the first insulation layers 160 under the uppermost one of the fourth sacrificial layers 170 may be partially exposed. A trimming process for reducing an area of the photoresist pattern is performed, and the uppermost one of the first insulation layers 160, the uppermost one of the fourth sacrificial layers 170, the exposed one of the first insulation layers 160, and one of the fourth sacrificial layers 170 thereunder may be etched again using the reduced photoresist pattern as an etching mask.

The etching process and the trimming process may be alternately and repeatedly performed to form a mold having a plurality of step layers each including the fourth sacrificial layer 170 and the first insulation layer 160 sequentially stacked on the substrate 100.

A first insulating interlayer 180 and an etch stop layer 190 may be sequentially formed on the support layer 150 to cover the mold, and the etch stop layer 190, the first insulating interlayer 180, the mold, the support layer 150 and the sacrificial layer structure 140 may be etched to form a hole 195 exposing an upper surface of the substrate 100. A second insulation layer 200, a channel layer 210 and a variable resistance layer 220 may be sequentially formed on a sidewall of the hole 195, the exposed upper surface of the substrate 100 and an upper surface of the etch stop layer 190, and a fifth sacrificial layer 230 may be formed on the variable resistance layer 220 to fill the hole 195. An interface layer having a thin thickness such as an oxide layer such as, for example, a silicon oxide layer including oxygen or a silicon nitride layer including nitrogen, may be formed between the channel 215 and the variable resistance pattern 225.

In exemplary embodiments, the etching process may be performed until the hole 195 exposes the upper surface of the substrate 100. The hole 195 may extend through an upper portion of the substrate 100. In exemplary embodiments, a plurality of holes 195 may be formed in each of the second and third directions, and thus, a hole array may be defined.

In exemplary embodiments, the fifth sacrificial layer 230 may include an oxide such as, e.g., silicon oxide, and the etch stop layer 190 may include a nitride such as, e.g., silicon nitride.

Figure 4:
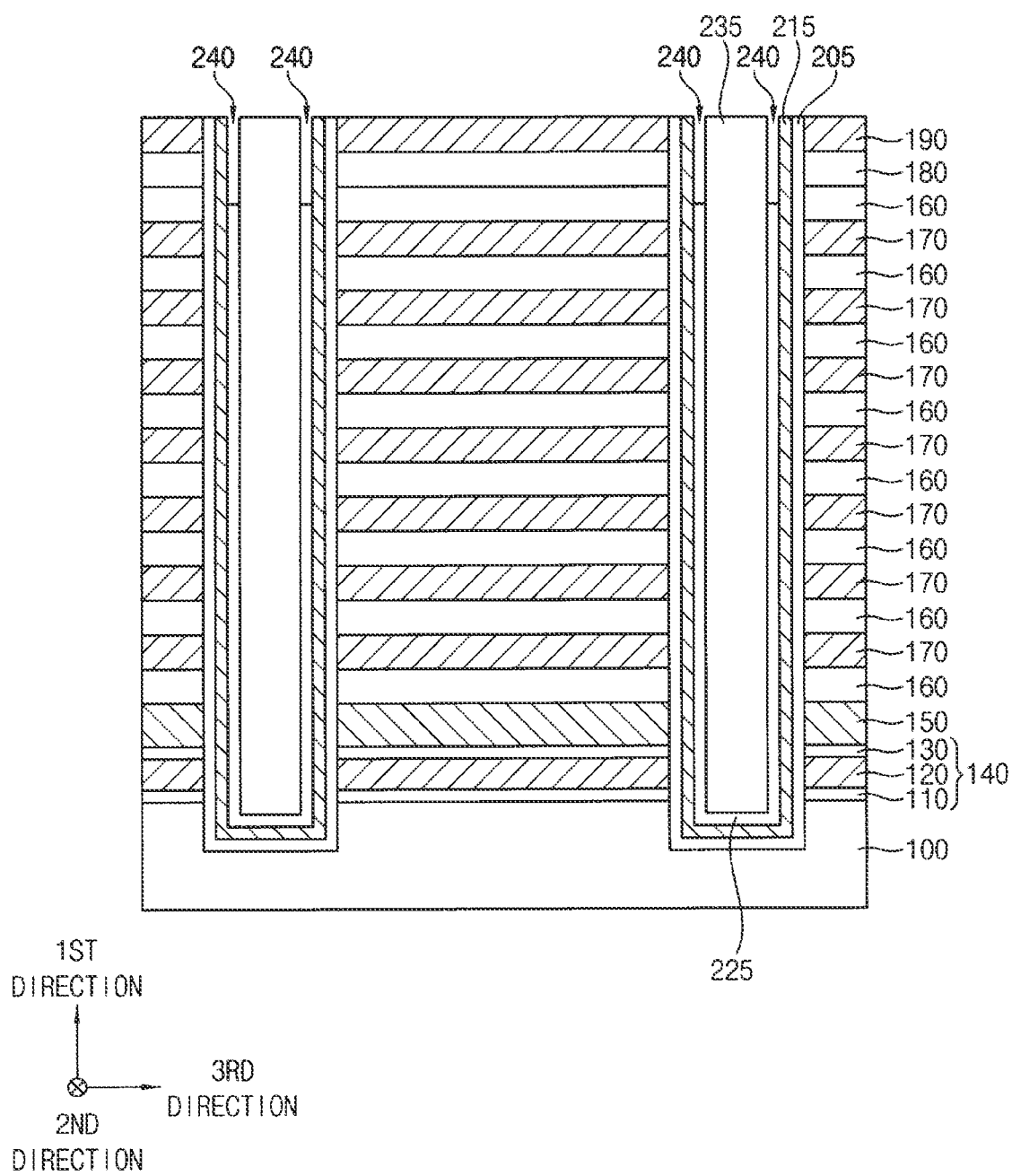

Referring to FIG. 4, the fifth sacrificial layer 230, the variable resistance layer 220, the channel layer 210 and the second insulation layer 200 may be planarized until the etch stop layer 190 is exposed so as to form a fifth sacrificial pattern 235, a variable resistance pattern 225, a channel 215 and a second insulation pattern 205, respectively.

In exemplary embodiments, the planarization process may be performed by a chemical mechanical polishing (CMP) process and/or an etch back process.

An upper portion of the variable resistance pattern 225 may be removed by, e.g., a wet etching process to form a first recess 240, and upper sidewalls of the channel 215 and the fifth sacrificial pattern 235 may be exposed by the first recess 240.

Figure 5:
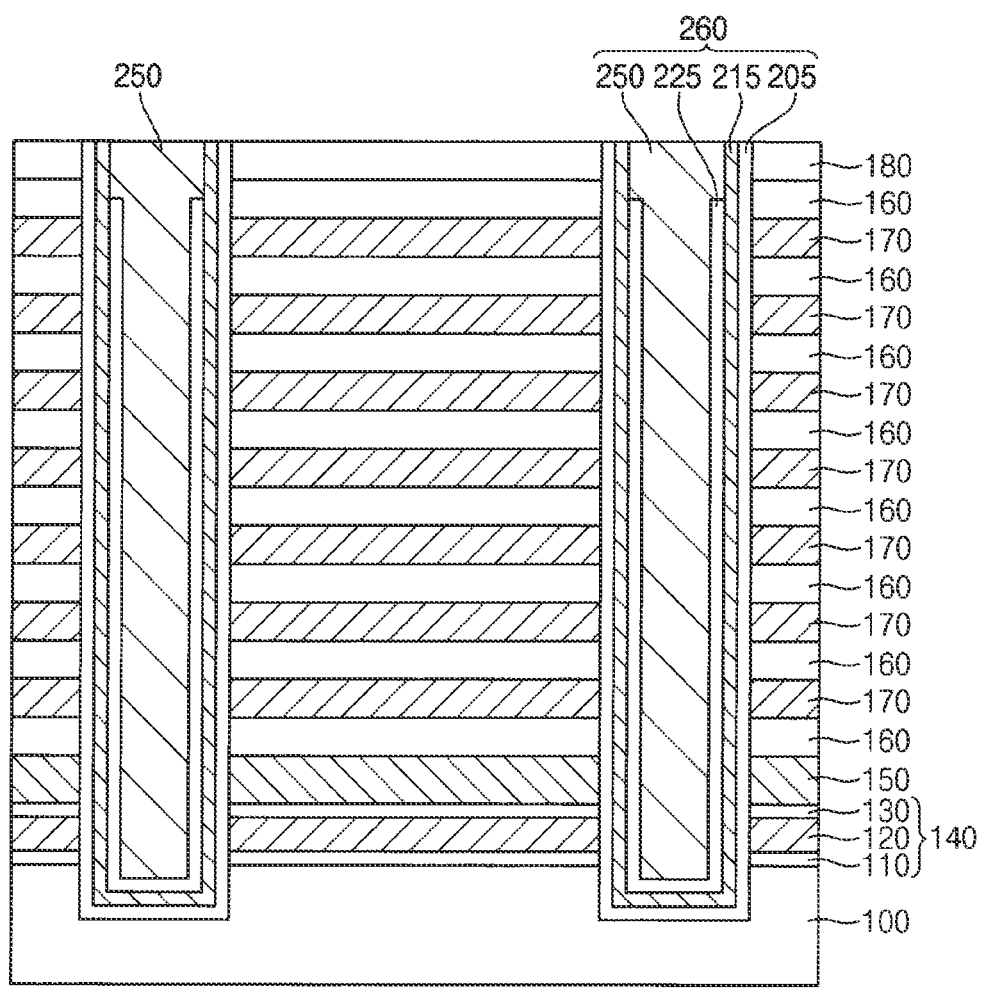

Referring to FIG. 5, the fifth sacrificial pattern 235 may be removed to form a second recess connected to the first recess 240, and a vertical gate electrode 250 may fill the first recess 240 and the second recess.

As the vertical gate electrode 250 fills the first recess 240, the vertical gate electrode 250 may contact the upper sidewall of the channel 215 exposed by the first recess 240 to be connected thereto. Thus, in an exemplary embodiment, the vertical gate electrode 250 may directly contact the upper sidewall of the channel 215.

The vertical gate electrode 250 extending in the first direction, and the variable resistance pattern 225, the channel 215 and the second insulation pattern 205 sequentially stacked on a sidewall and a bottom surface of the vertical gate electrode 250, may be formed in the hole 195 to form a pillar structure 260. As the holes 195 are arranged in the second and third directions to form the hole array, the channels 215 in the pillar structures 260, respectively, may be arranged in the second and third directions to form a channel array.

Figure 6:
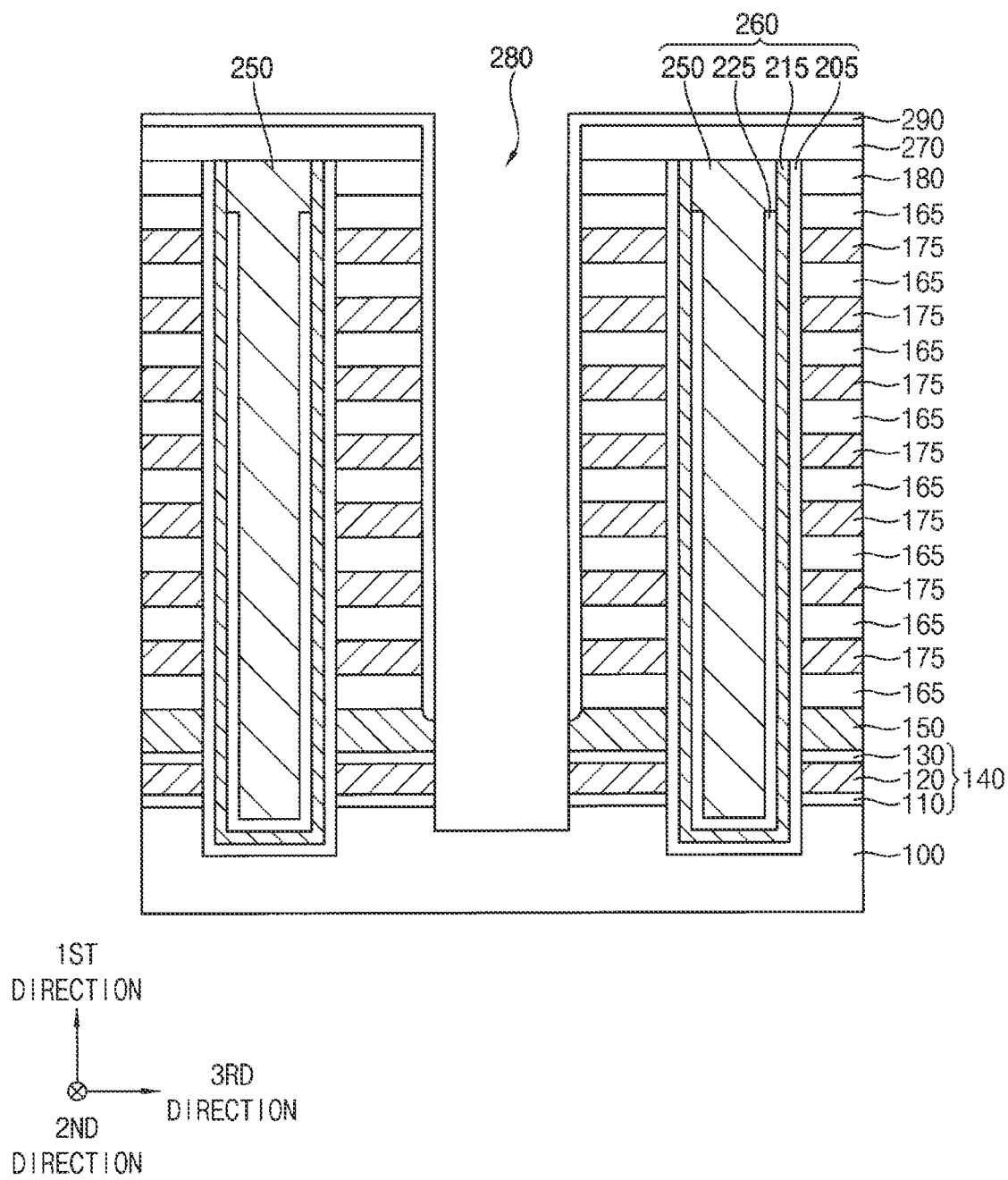

Referring to FIG. 6, a second insulating interlayer 270 may be formed on the first insulating interlayer 180 and the pillar structure 260, and a second opening 280 may be formed through the first and second insulating interlayers 180 and 270 and the mold by an etching process.

The etching process may be performed until the second opening 280 exposes an upper surface of the support layer 150 or an upper surface of the support pattern, and the second opening 280 may extend through an upper portion thereof. As the second opening 280 is formed, the first insulation layer 160 and the fourth sacrificial layer 170 of the mold may be exposed by the second opening 280.

In exemplary embodiments, the second opening 280 may extend in the second direction on the substrate 100, and a plurality of second openings 280 may be formed in the third direction. As the second opening 280 is formed, the first insulation layer 160 may be divided into a plurality of first insulation patterns 165 spaced apart from one another in the third direction, each of which may extend in the second direction. The fourth sacrificial layer 170 may be divided into a plurality of fourth sacrificial patterns 175 spaced apart from one another in the third direction, each of which may extend in the second direction.

A first spacer layer may be formed on a sidewall of the second opening 280, an upper surface of the support layer 150 or the support pattern, and an upper surface of the second insulating interlayer 270. A portion of the first spacer layer on the upper surface of the support layer 150 or the support pattern may be removed by, for example, an anisotropic etching process to form a first spacer 290, and thus, the upper surface of the support layer 150 or the support pattern may be partially exposed.

The exposed portion of the support layer 150 and the support pattern and a portion of the sacrificial layer structure 140 thereunder may be removed to enlarge the second opening 280 downwardly. Thus, the second opening 280 may expose an upper surface of the substrate 100, and may further extend through an upper portion of the substrate 100.

In exemplary embodiments, the first spacer 290 may include, e.g., undoped polysilicon.

When the sacrificial layer structure is partially removed, the sidewall of the second opening 280 may be covered by the first spacer 290. Thus, in an exemplary embodiment, the first insulation pattern 165 and the fourth sacrificial pattern 175 included in the mold are not removed.

Figure 7:
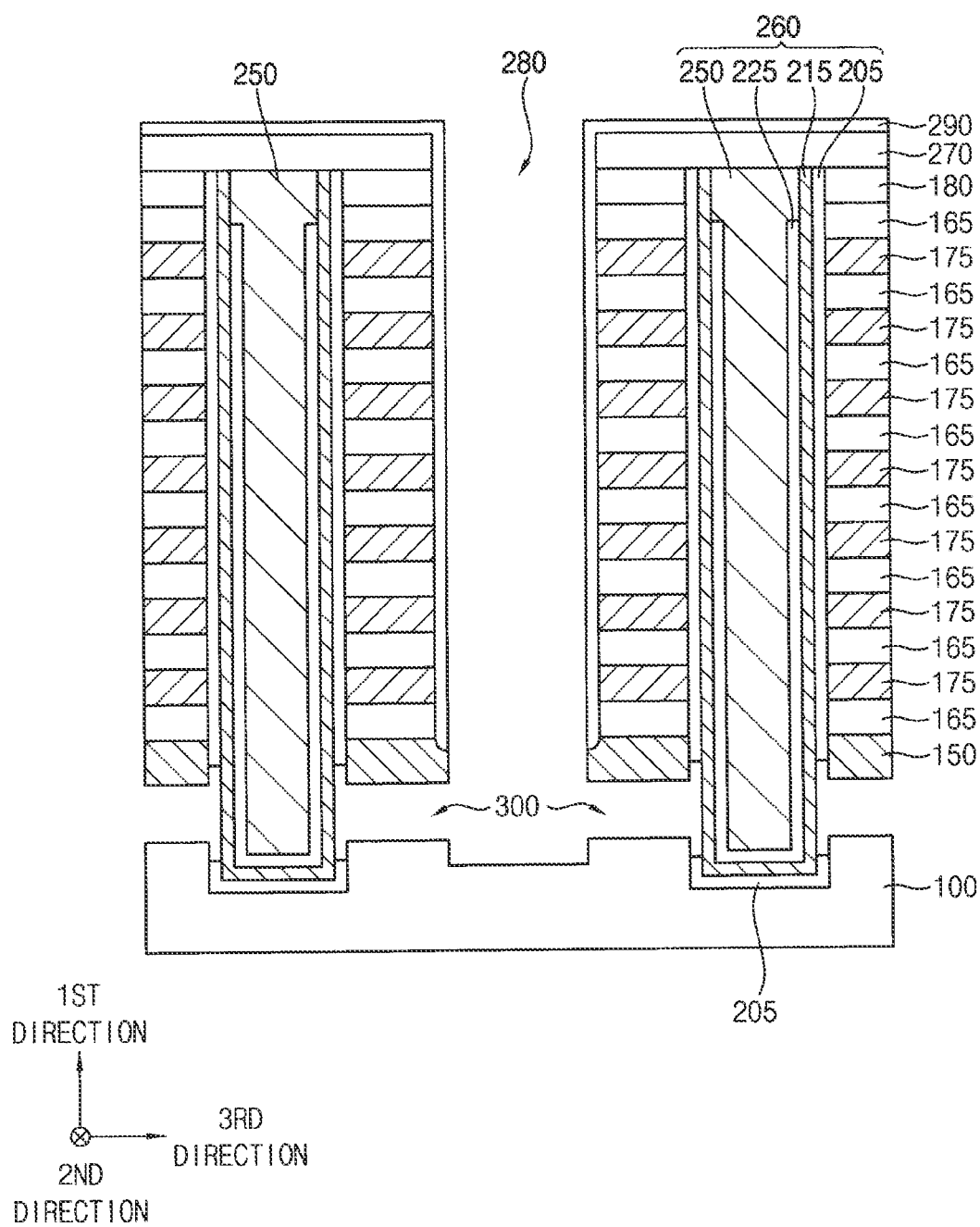

Referring to FIG. 7, the sacrificial layer structure 140 may be removed through the second opening 280 by, e.g., a wet etching process, and thus, a first gap 300 may be formed.

When the sacrificial layer structure 140 is removed, a portion of the second insulation pattern 205 adjacent thereto may be also removed, and thus, a portion of an outer sidewall of the channel 215 may be exposed. The wet etching process may be performed using, e.g., fluoric acid (HF) and/or phosphoric acid ($H_3PO_4$) as an etchant. As the first gap 300 is formed, the second insulation pattern 205 may be divided into a lower portion on the substrate 100 and an upper portion in the mold, which may be spaced apart from the lower portion in the first direction.

In an exemplary embodiment, when the first gap 300 is formed by the wet etching process, the support layer 150 and the support pattern are not removed, and thus, the mold does not collapse.

Figure 8:
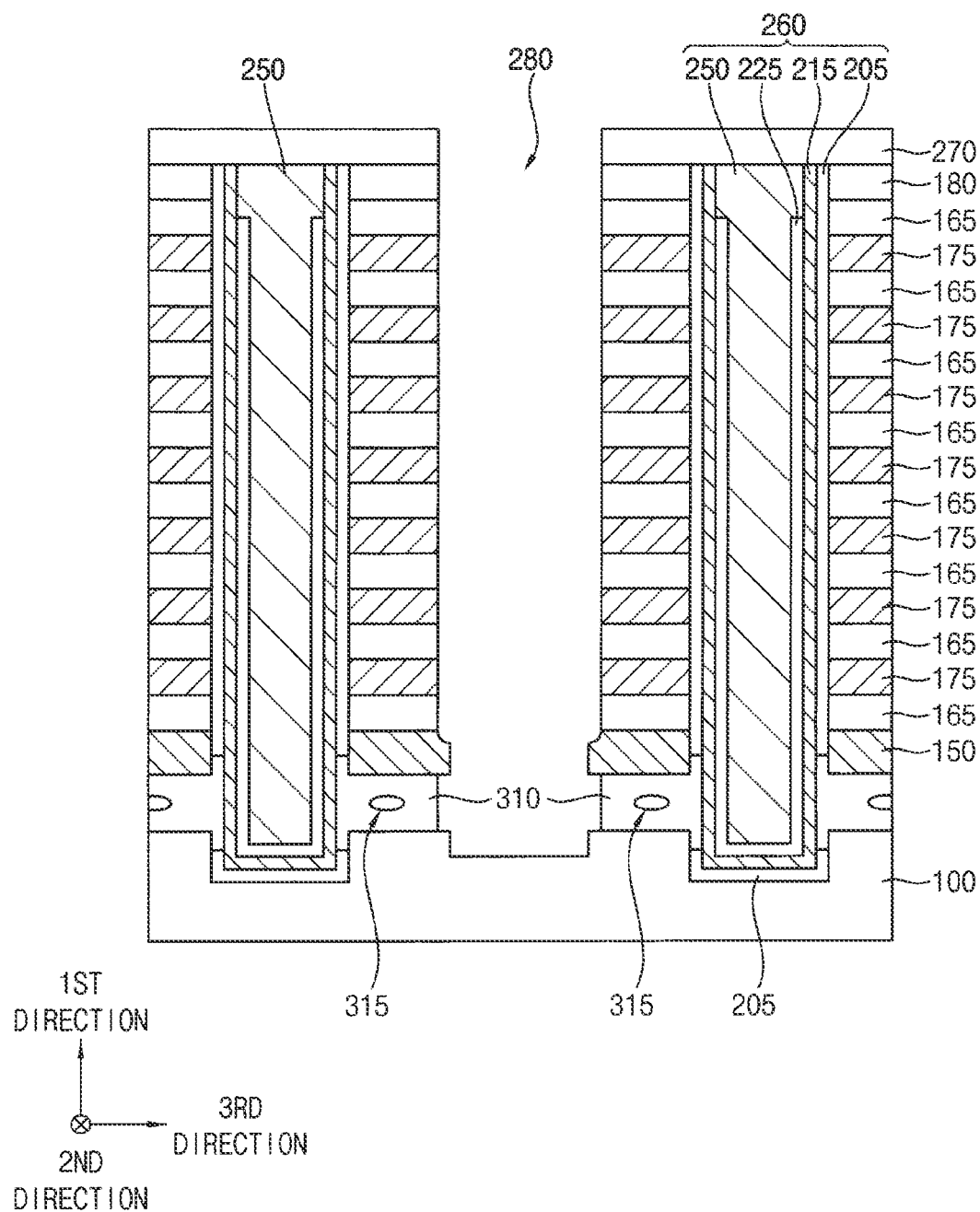

Referring to FIG. 8, the first spacer 290 may be removed, a channel connection layer may be formed on a sidewall of the second opening 280 and in the first gap 300, and a portion of the channel connection layer in the second opening 280 may be removed by, e.g., an etch back process to form a channel connection pattern 310 in the first gap 300.

As the channel connection pattern 310 is formed, the channels 215 forming the channel array may be connected to each other. The channel connection pattern 310 may include an air gap 315 therein.

Figure 9:
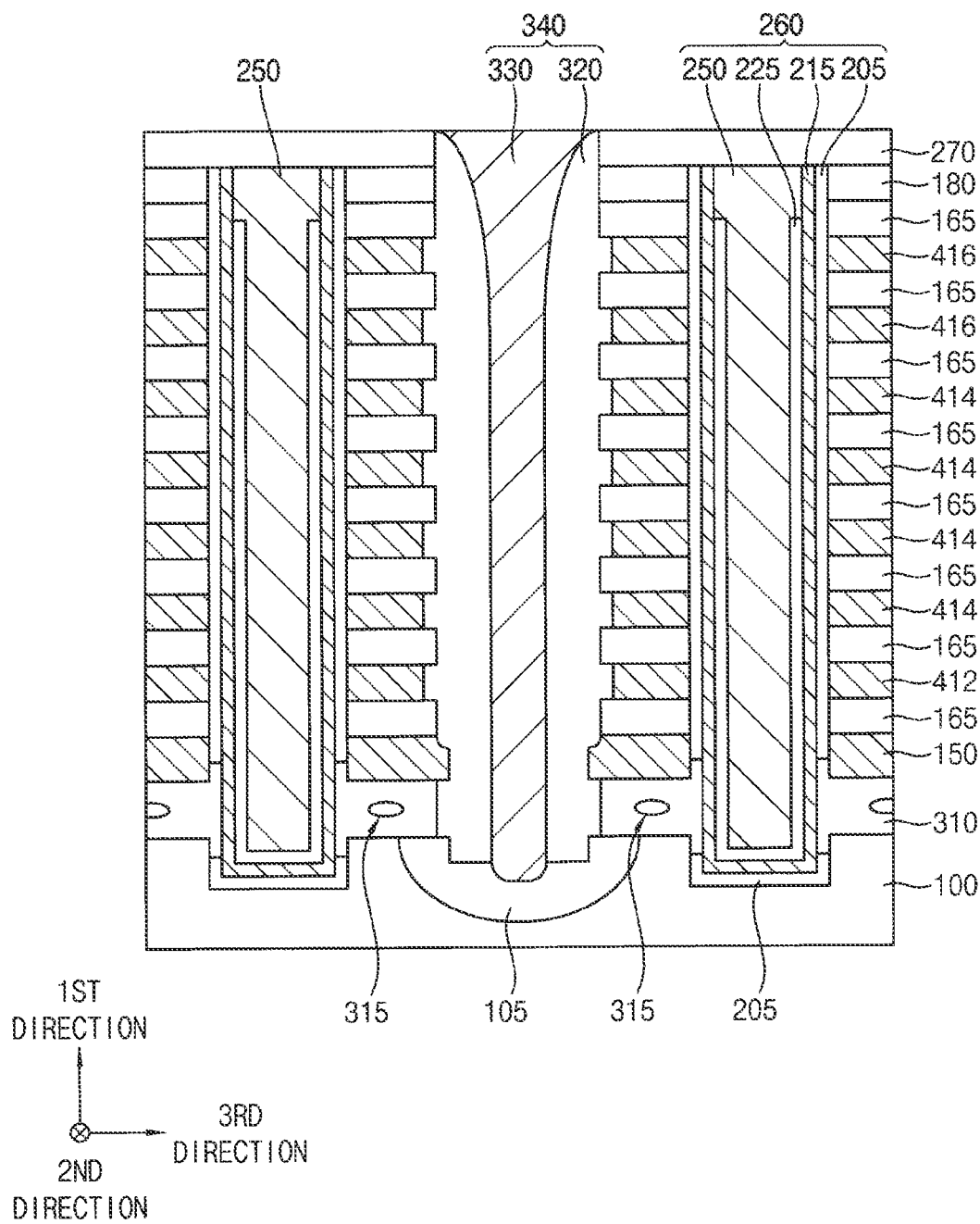

Referring to FIG. 9, the fourth sacrificial patterns 175 exposed by the second opening 280 may be removed to form a second gap between the first insulation patterns 165 at the plurality of levels, respectively, and a portion of an outer sidewall of the second insulation pattern 205 may be exposed by the second gap.

In exemplary embodiments, the fourth sacrificial patterns 175 may be removed by a wet etching process using, e.g., phosphoric acid ($H_3PO_4$) or fluoric acid (HF).

A gate electrode layer may fill the second gaps in the second opening 280, and may be partially etched by, e.g., a wet etching process to form gate electrodes in the second gaps, respectively. In exemplary embodiments, each of the gate electrodes may include a gate conductive pattern and a gate barrier pattern covering lower and upper surfaces and a sidewall of the gate conductive pattern.

In exemplary embodiments, the gate electrode may extend in the second direction, and a plurality of gate electrodes may be formed at a plurality of levels, respectively, to be spaced apart from one another in the first direction. Additionally, a plurality of gate electrodes may be formed in the third direction. That is, the gate electrodes, each of which may extend in the second direction at the same level, may be spaced apart from one another in the third direction by the second opening 280. The gate electrode may include first, second and third gate electrodes 412, 414 and 416 sequentially stacked in the first direction.

A CSL 105 may be formed at an upper portion of the substrate 100 exposed by the second opening 280, a second spacer 320 may be formed on a sidewall of the second opening 280, and a CSP 330 may fill the second opening 280.

The CSL 105 may be formed by doping n-type impurities, e.g., phosphorous impurities, into the upper portion of the substrate 100, and thus, may be an impurity region.

In an exemplary embodiment, the CSP 330 may extend in the second direction, and may form a division structure 340 together with the second spacer 320 on a sidewall thereof, which may divide each of the first to third gate electrodes 412, 414 and 416 in the third direction. In an exemplary embodiment, a plurality of CSPs 330 may be spaced apart from one another in the second direction. In an exemplary embodiment, the CSP 330 is not formed, and in this case, the division structure 340 may include only the second spacer 320.

Referring again to FIG. 1, a third insulating interlayer 350 may be formed on the second insulating interlayer 270 and the division structure 340, and a contact plug 360 extending through the second and third insulating interlayers 270 and 350 to contact an upper surface of the vertical gate electrode 250 may be formed.

A fourth insulating interlayer may be formed on the third insulating interlayer 350, and a bit line 370 may be formed through the fourth insulating interlayer to contact an upper surface of the contact plug 360. Thus, the vertical variable resistance memory device may be manufactured.

In exemplary embodiments, the bit line 370 may extend in the third direction, and a plurality of bit lines 370 may be spaced apart from one another in the second direction.

As illustrated above, the upper portion of the variable resistance pattern 225 may be removed to form the first recess 240 exposing the upper sidewall of the channel 215, the fifth sacrificial pattern 235 may be removed to form the second recess, and the vertical gate electrode 250 may fill the first recess 240 and the second recess. Accordingly, the vertical gate electrode 250 may extend in the first direction to be connected to the channel 215 and may face each of the first to third gate electrodes 412, 414 and 416 in the horizontal direction.

Hereinafter, an operation method in the vertical variable resistance memory device will be explained. The vertical variable resistance memory device may include a plurality of memory blocks, each of which may include a plurality of memory cells, and the plurality of memory blocks may form a memory cell array. Each of the memory blocks may include cell strings having a vertical structure, and each of the cell strings may include a string selection transistor SST, the plurality of memory cells, and a ground selection transistor GST disposed in series between a bit line BL and a common source line CSL. For example, each of the cell strings may include a string selection transistor SST, the plurality of memory cells, and a ground selection transistor GST disposed sequentially between a bit line BL and a common source line CSL.

The string selection transistors SSTs disposed in the second direction may be electrically connected to a string selection line SSL, the ground selection transistors GSTs disposed in the second direction may be electrically connected to a ground selection line GSL, and the gate electrodes 414 included in the memory cells disposed in the second direction may form a word line WL.

In the vertical variable resistance memory device, one channel 215 (refer to FIG. 1) may be shared by each of the gate electrodes 412, 414 and 416 and the vertical gate electrode 250, and each of the second gate electrodes 414, the second insulation pattern 205, the channel 215, the variable resistance pattern 225 and the vertical gate electrode 250 may form each of the memory cells. The memory cells included in each of the cell strings may commonly include the vertical gate electrode 250.

Figure 10:
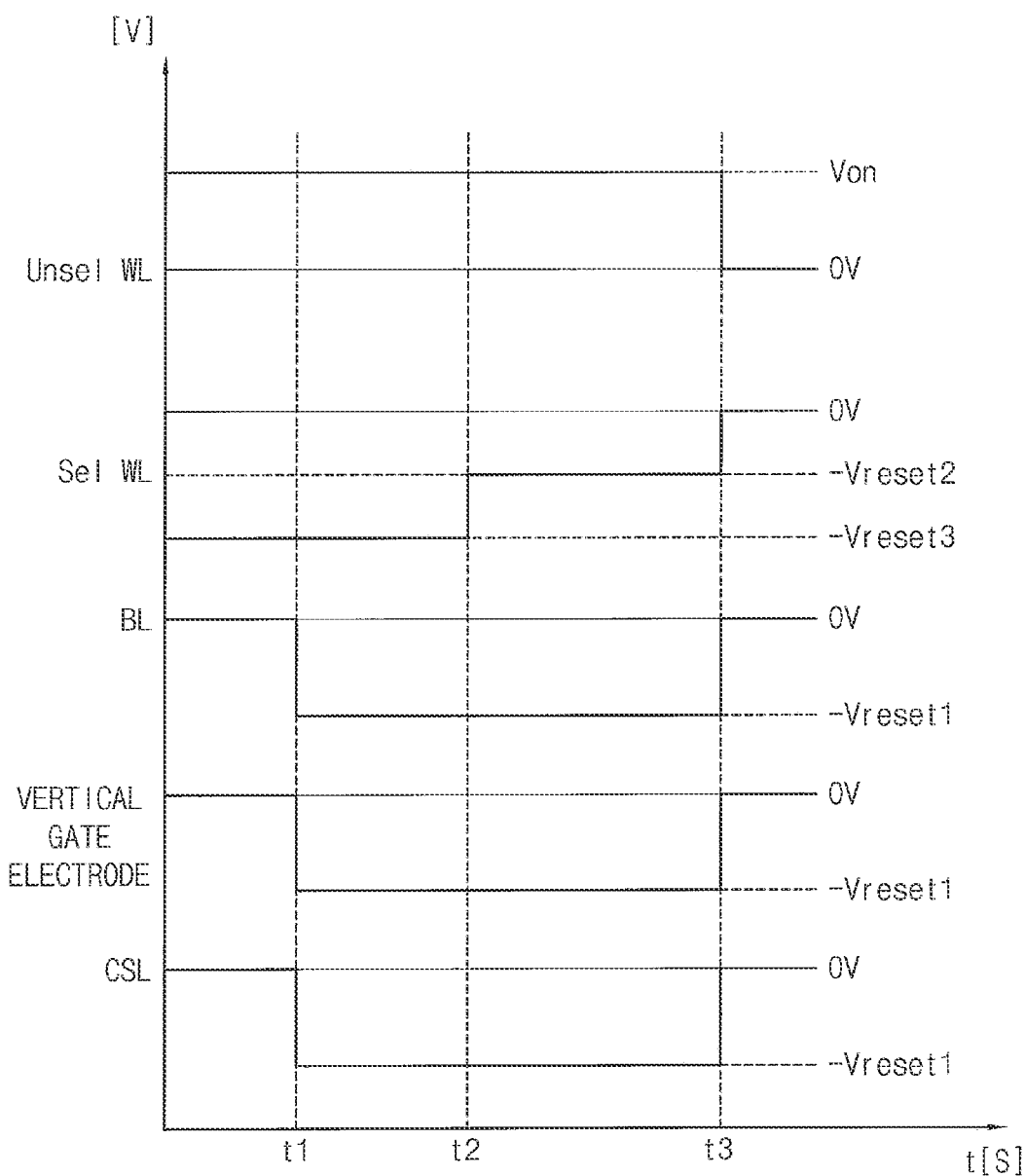
FIG. 10 is a timing diagram illustrating a method of performing a reset operation in a vertical variable resistance memory device in accordance with exemplary embodiments.

FIG. 10 is a timing diagram illustrating a method of performing a reset operation in the vertical variable resistance memory device in accordance with exemplary embodiments. FIGS. 11 to 14 are cross-sectional views of a portion of the vertical variable resistance memory device in accordance with exemplary embodiments.

Figure 11:
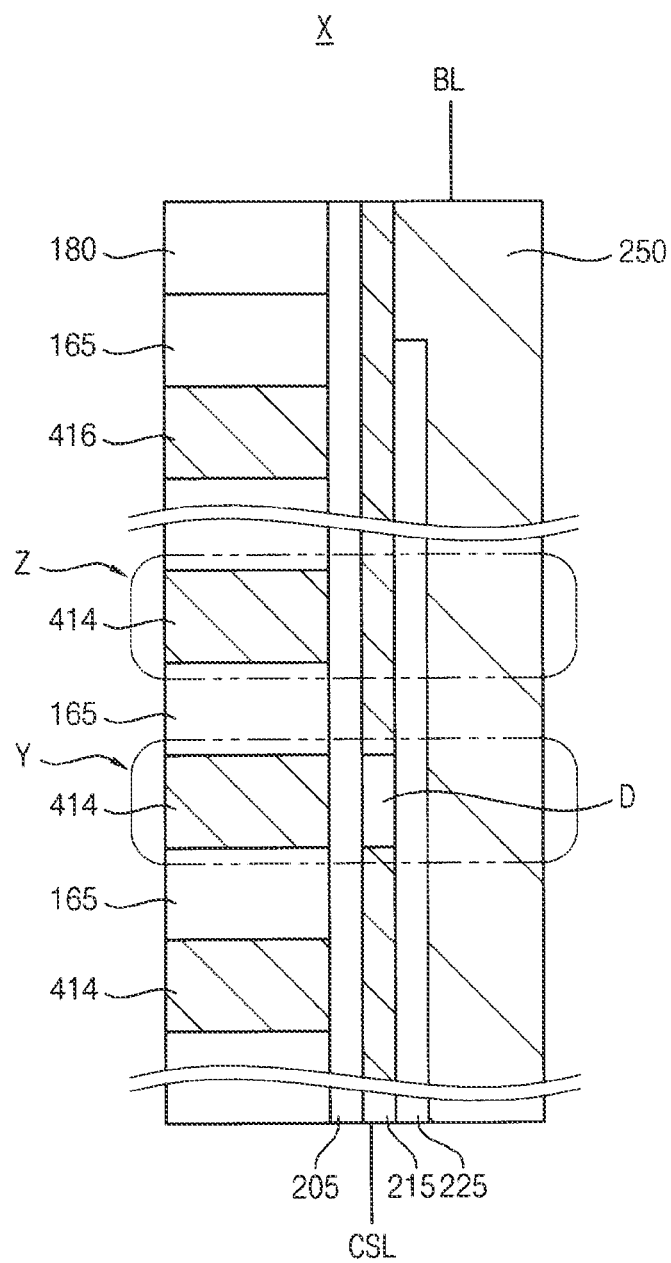
FIGS. 11 to 14 are cross-sectional views of a portion of a vertical variable resistance memory device in accordance with exemplary embodiments.
Figure 12:
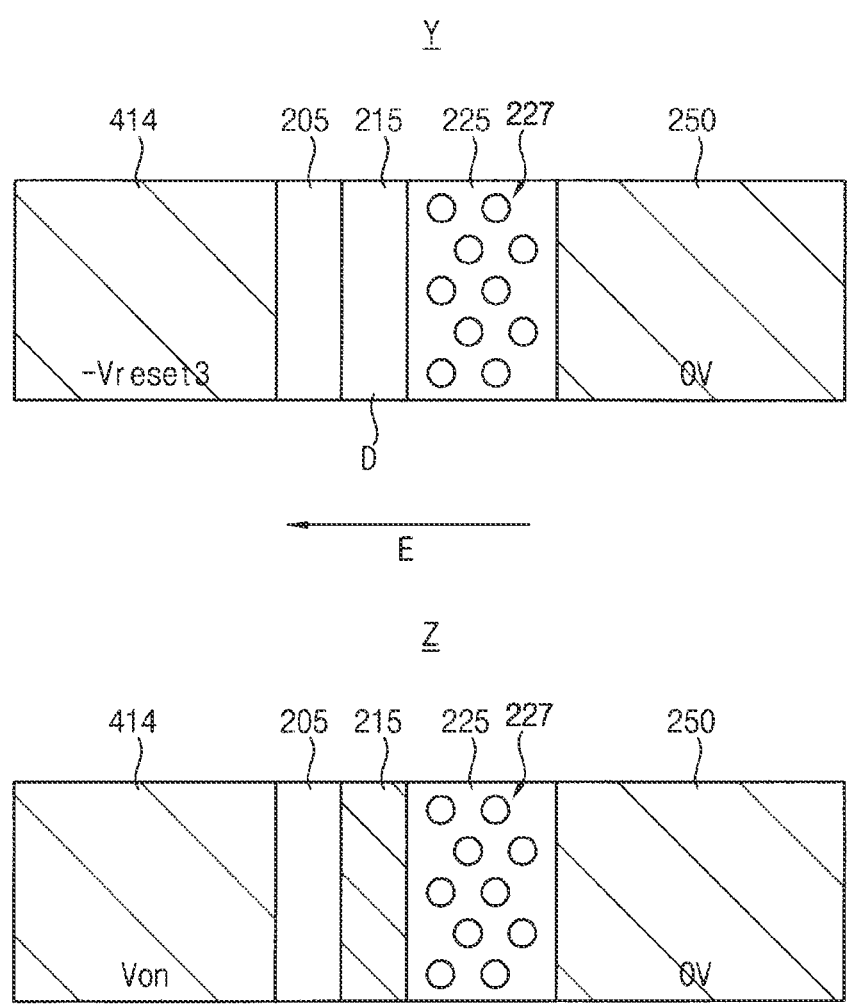

FIG. 11 is a drawing of region X of FIG. 1. Each of FIGS. 12 to 14 includes enlarged cross-sectional views of regions Y and Z of FIG. 11. A word line shown in region Y may be a word line of a selected memory cell, that is, a selected word line Sel WL, and a word line shown in region Z may be a word line of an unselected memory cell, that is, an unselected word line Unsel WL.

Referring to FIGS. 10 to 12, 0 V may be applied to both the bit line BL and the common source line CSL, and a turn-on voltage Von and a third reset voltage −Vreset3 may be applied to the unselected word line Unsel WL and the selected word line Sel WL, respectively, in the cell string. Thus, 0 V may also be applied to the vertical gate electrode 250 electrically connected to the bit line BL.

The bit line BL and the common source line CSL electrically connected to opposite ends, respectively, of the channel 215 have the same electric potential, and thus, in exemplary embodiments, a vertical current flowing through the channel 215 is not generated. However, an electric field E in a first horizontal direction shown in FIG. 12 may be generated between the selected word line Sel WL and the vertical gate electrode 250 facing each other in the horizontal direction by a difference between the third reset voltage −Vreset3 and 0 V, so that a depletion region D may be formed at a portion of the channel 215 between the selected word line Sel WL and the vertical gate electrode 250. Additionally, an inversion layer may be formed at a portion of the channel 215 adjacent to the unselected word line Unsel WL by a difference between the turn-on voltage Von and 0 V.

Oxygen vacancies 227 may be uniformly distributed in the variable resistance pattern 225.

Figure 13:
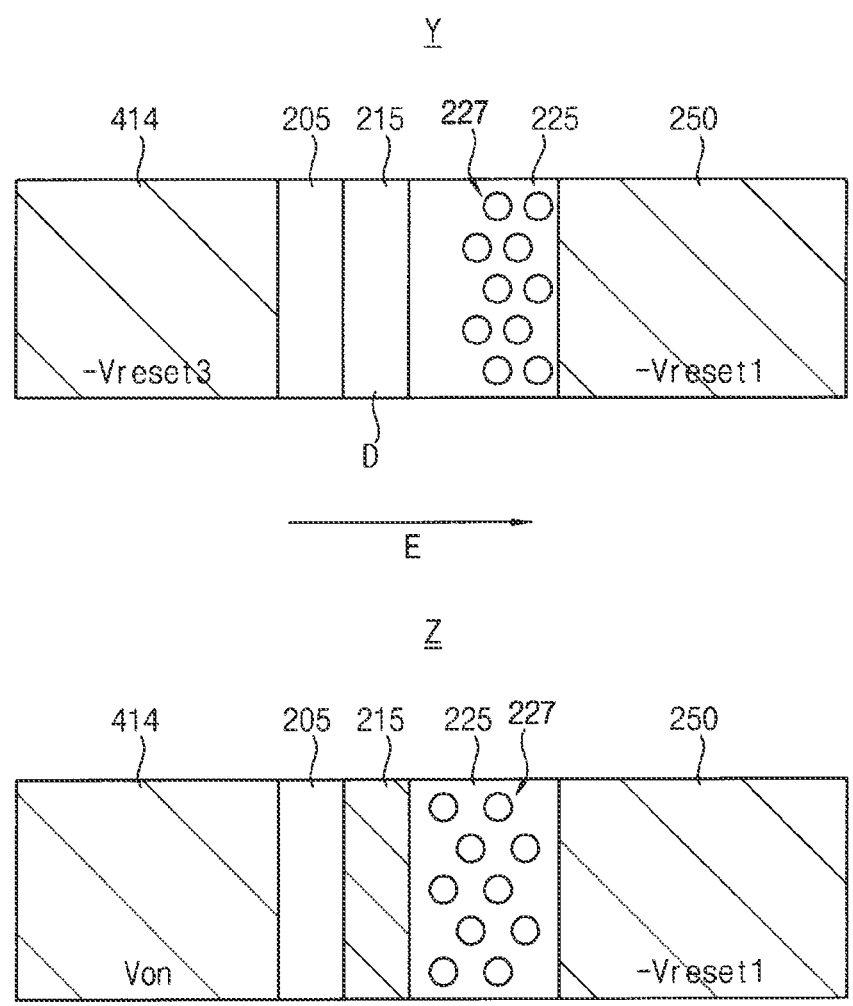

Referring to FIGS. 10, 11 and 13, a first reset voltage −Vreset1 having an absolute value greater than that of the third reset voltage −Vreset3 may be applied to the bit line BL and the common source line CSL at a first time t1, and thus, the first reset voltage −Vreset1 may be applied to the vertical gate electrode electrically connected to the bit line BL. The unselected word line Unsel WL and the selected word line Sel WL may have the turn-on voltage Von and the third reset voltage −Vreset3, respectively, which are the same voltages as the previous ones, respectively.

The depletion region D at the portion of the channel 215 between the selected word line Sel WL and the vertical gate electrode 250 may remain. However, an electric field E may be generated in a second horizontal direction that is a reverse direction to the first horizontal direction as shown in FIG. 13, by an electric potential difference between the selected word line Sel WL and the vertical gate electrode 250 facing each other in the horizontal direction, that is, a difference between the third reset voltage −Vreset3 and the first reset voltage −Vreset1. As a result, the oxygen vacancies 227 uniformly distributed in the variable resistance pattern 225 may move to a portion of the variable resistance pattern 225 distal to the channel 215.

Figure 14:
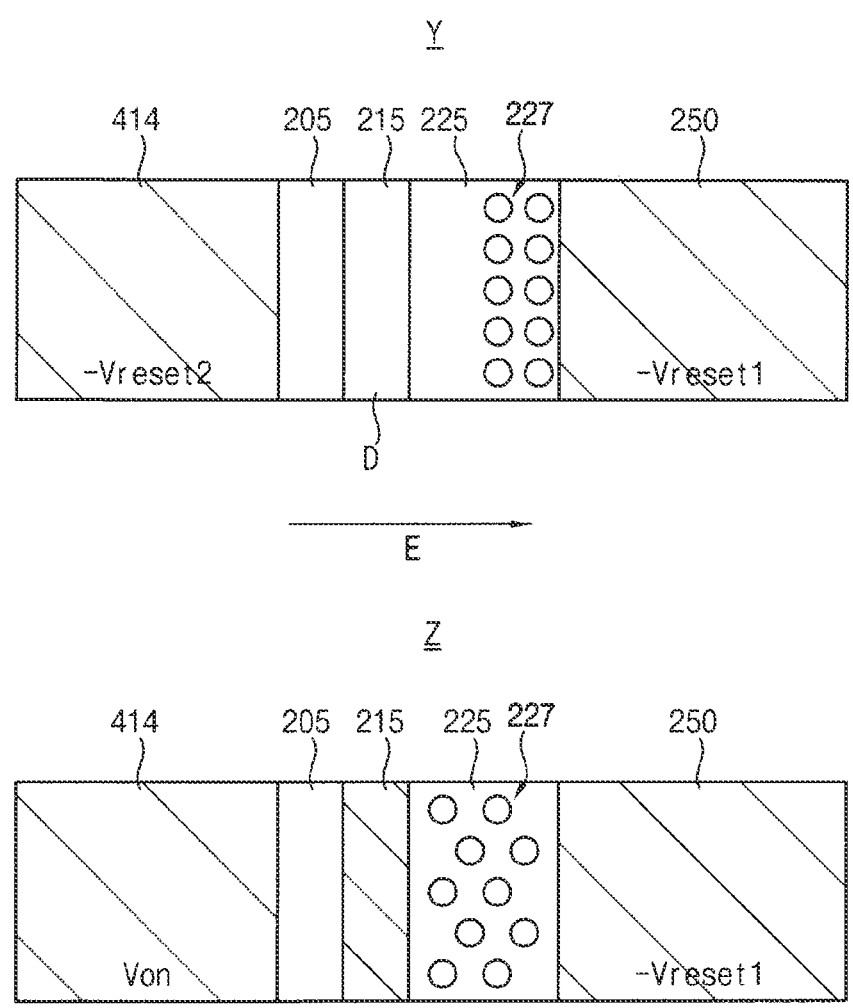

Referring to FIGS. 10, 11 and 14, a second reset voltage −Vreset2 having an absolute value less than that of the first reset voltage −Vreset1 may be applied to the selected word line Sel WL at a second time t2, which may be maintained until a third time t3.

Thus, the electric potential difference between the selected word line Sel WL and the vertical gate electrode 250 facing each other may increase, and thus, an electric field E in the second horizontal direction may be generated as shown in FIG. 14, by a difference between the second reset voltage −Vreset2 and the first reset voltage −Vreset1. As a result, the oxygen vacancies 227 distributed at the portion of the variable resistance pattern 225 distal to the channel 215 may be more compact to be arranged in the vertical direction.

By the above processes, the reset operation of the selected memory cell in the cell string may be performed.

Figure 15:
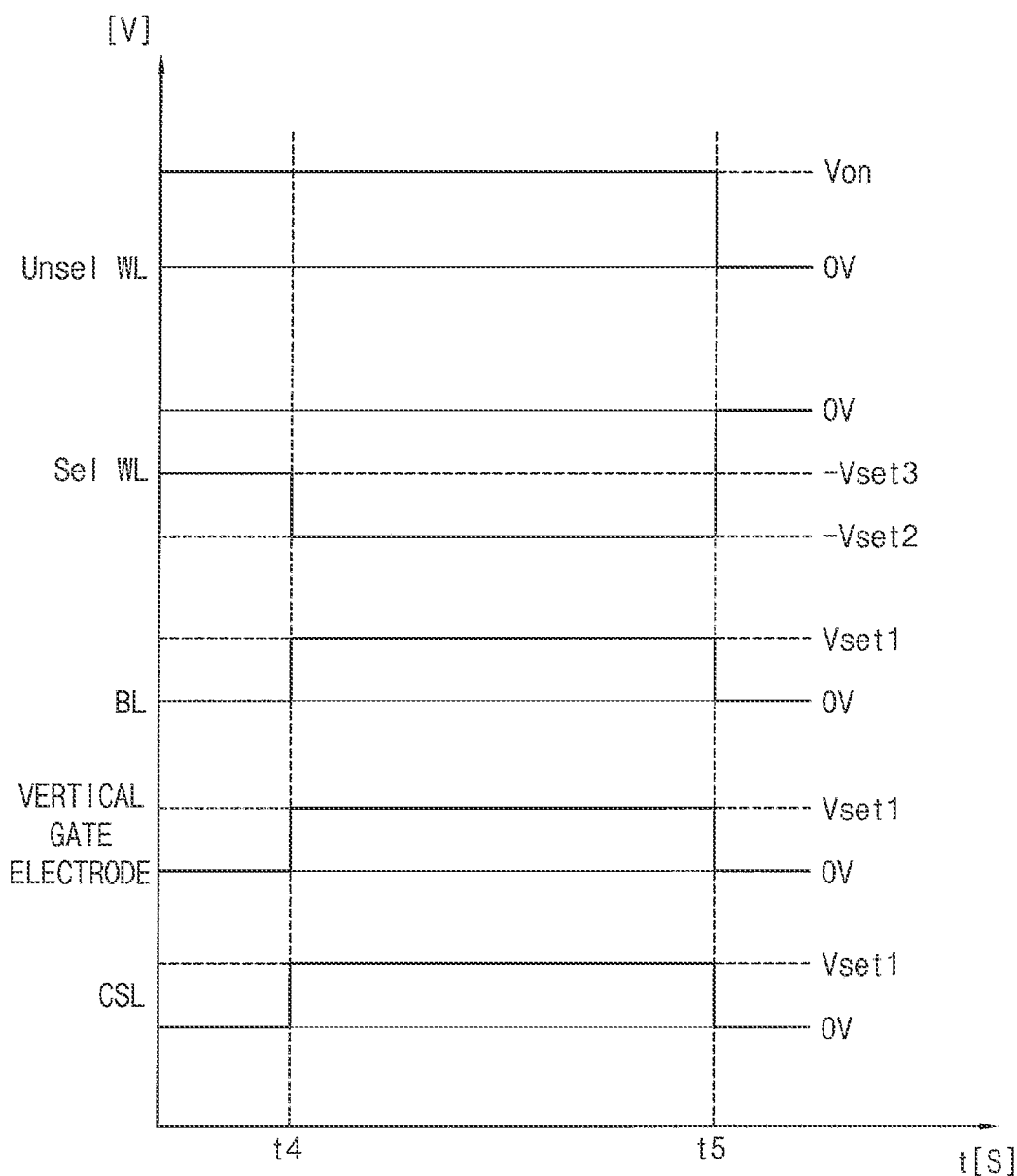
FIG. 15 is a timing diagram illustrating a method of performing a set operation in a vertical variable resistance memory device in accordance with exemplary embodiments.
Figure 16:
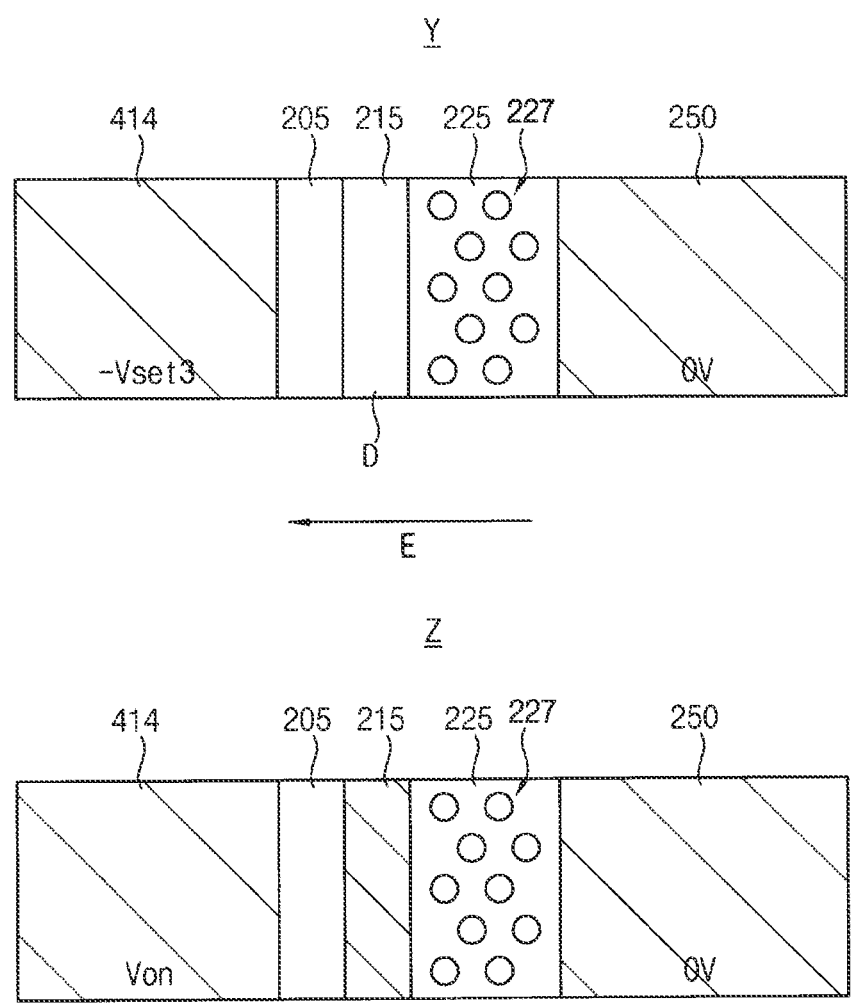
FIGS. 16 and 17 are cross-sectional views of a portion of a vertical variable resistance memory device in accordance with exemplary embodiments.
Figure 17:
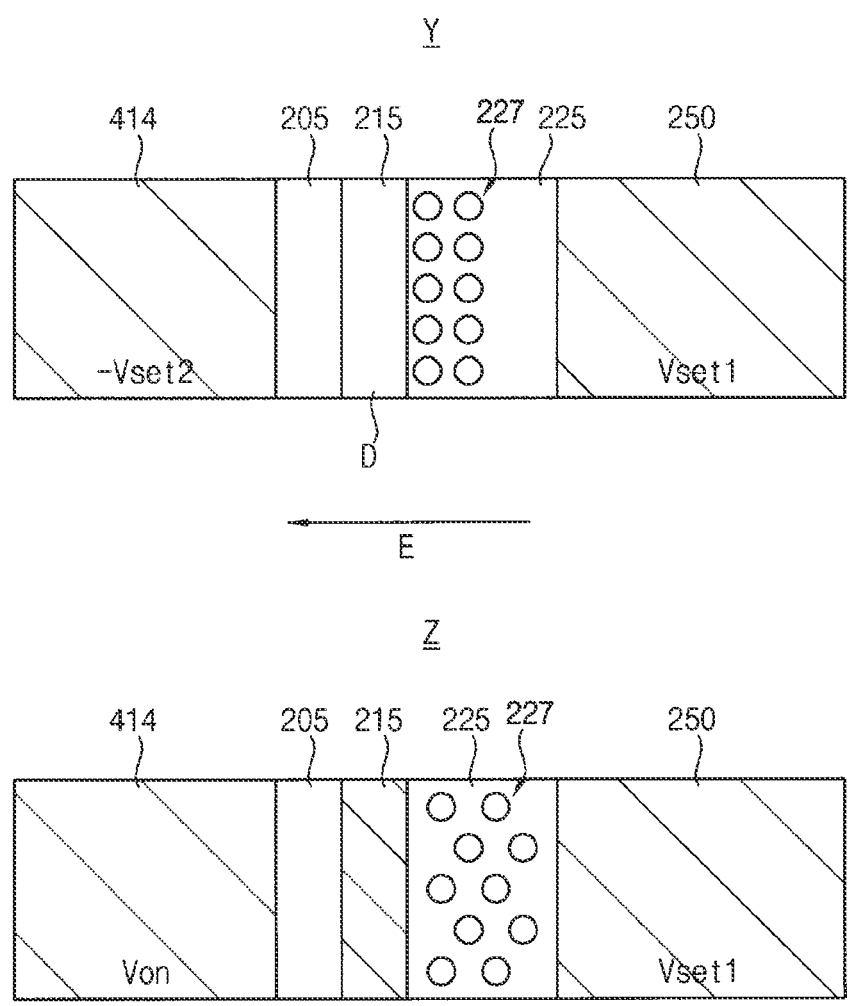

FIG. 15 is a timing diagram illustrating a method of performing a set operation in the vertical variable resistance memory device in accordance with exemplary embodiments. FIGS. 16 and 17 are cross-sectional views of a portion of the vertical variable resistance memory device in accordance with exemplary embodiments.

Each of FIGS. 16 and 17 includes enlarged cross-sectional views of regions Y and Z of FIG. 11. Word lines shown in regions Y and Z, respectively, may be word lines of a selected word line Sel WL and an unselected word line Unsel WL, respectively.

Referring to FIGS. 11, 15 and 16, 0 V may be applied to both the bit line BL and the common source line CSL, and a turn-on voltage Von and a third set voltage −Vset3 may be applied to the unselected word line Unsel WL and the selected word line Sel WL, respectively, in the cell string. Thus, 0 V may also be applied to the vertical gate electrode 250 electrically connected to the bit line BL.

The bit line BL and the common source line CSL electrically connected to opposite ends, respectively, of the channel 215 have the same electric potential, and thus, in an exemplary embodiment, a vertical current flowing through the channel 215 is not generated. However, an electric field E in the first horizontal direction shown in FIG. 12 may be generated between the selected word line Sel WL and the vertical gate electrode 250 facing each other in the horizontal direction by a difference between the third set voltage −Vset3 and 0 V, so that a depletion region D may be formed at a portion of the channel 215 between the selected word line Sel WL and the vertical gate electrode 250. Additionally, an inversion layer may be formed at a portion of the channel 215 adjacent to the unselected word line Unsel WL by a difference between the turn-on voltage Von and 0 V.

Oxygen vacancies 227 may be uniformly distributed in the variable resistance pattern 225.

Referring to FIGS. 11, 15 and 17, a first set voltage Vset1 may be applied to the bit line BL and the common source line CSL at a fourth time t4, and may be maintained until a fifth time t5. Thus, the first set voltage Vset1 may be applied to the vertical gate electrode electrically connected to the bit line BL.

A second set voltage −Vset2 having an absolute value greater than that of the third set voltage −Vset3 may be applied to the selected word line Sel WL, and may be maintained until the fifth time t5.

As the electric potential difference between the selected word line Sel WL and the vertical gate electrode 250 facing each other in the horizontal direction increases, the oxygen vacancies 227 uniformly distributed in the portion of the variable resistance pattern 225 therebetween may move in the first horizontal direction to a portion of the variable resistance pattern 225 adjacent to the channel 215, by the difference between the second set voltage −Vset2 and the first set voltage Vset1 to be arranged in the vertical direction.

By the above processes, the set operation of the selected memory cell in the cell string may be performed.

Figure 18:
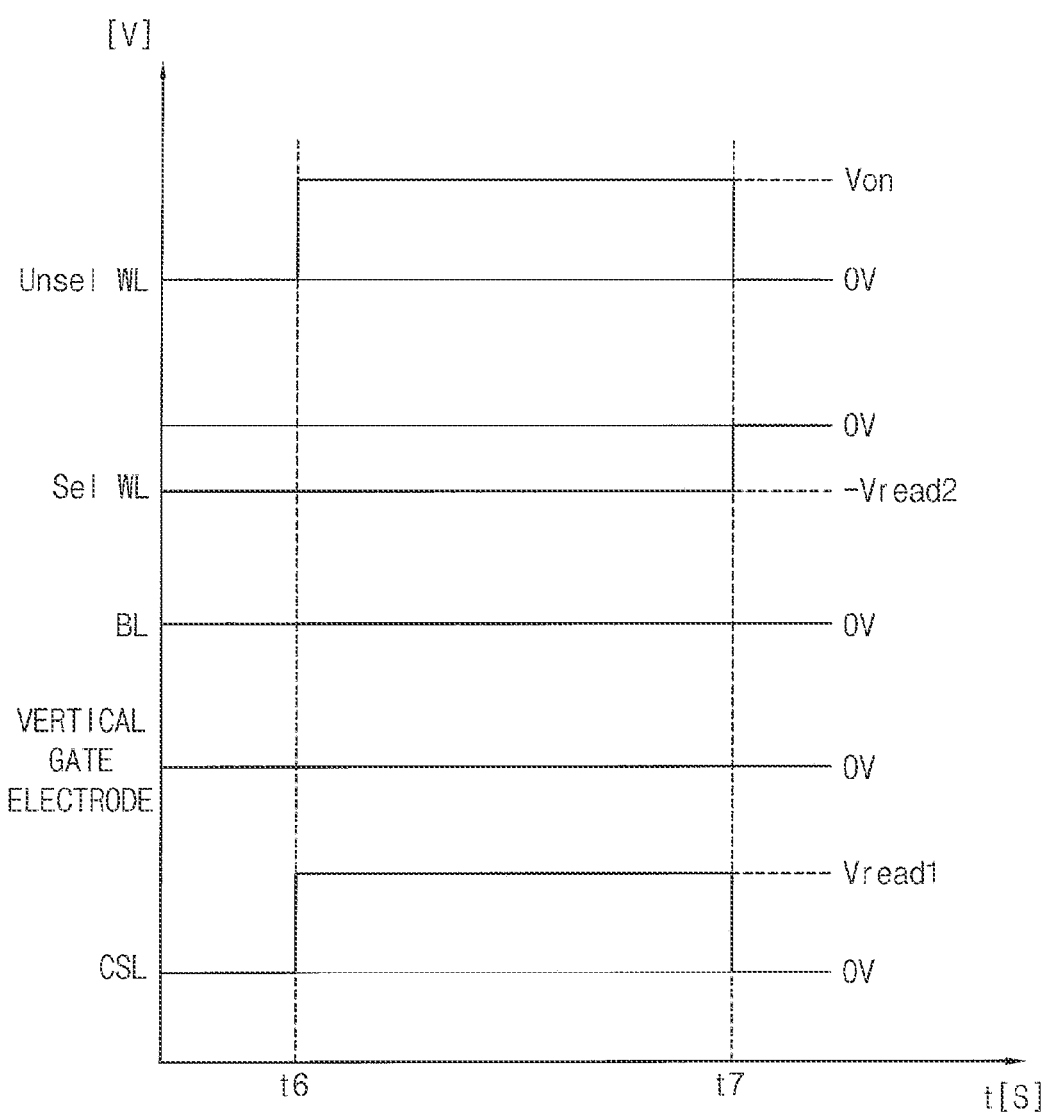
FIG. 18 is a timing diagram illustrating a method of performing a read operation in a vertical variable resistance memory device in accordance with exemplary embodiments.

FIG. 18 is a timing diagram illustrating a method of performing a read operation in the vertical variable resistance memory device in accordance with exemplary embodiments. FIGS. 19 to 22 are cross-sectional views of a portion of the vertical variable resistance memory device.

Figure 19:
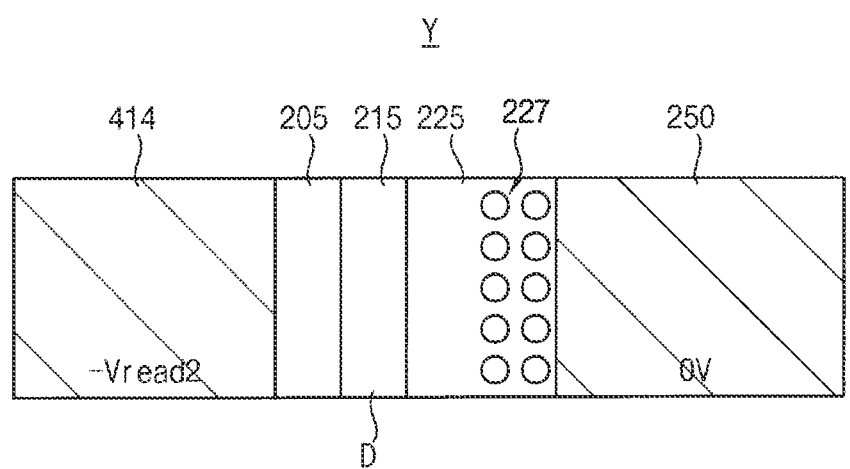
FIGS. 19 to 22 are cross-sectional views of a portion of a vertical variable resistance memory device in accordance with exemplary embodiments.
Figure 19:
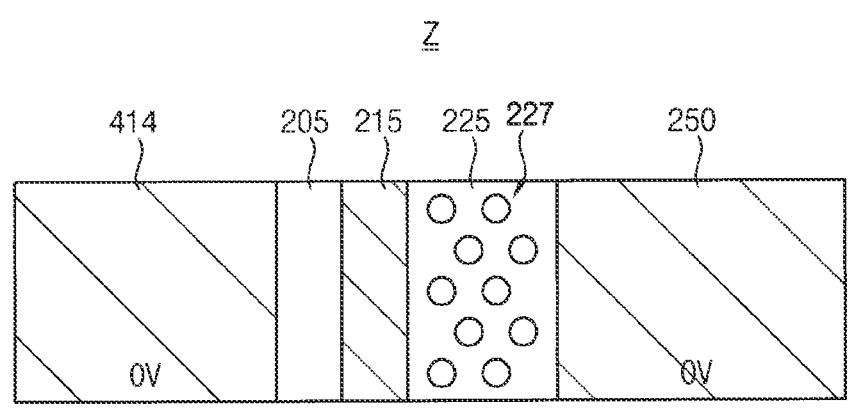
Figure 20:
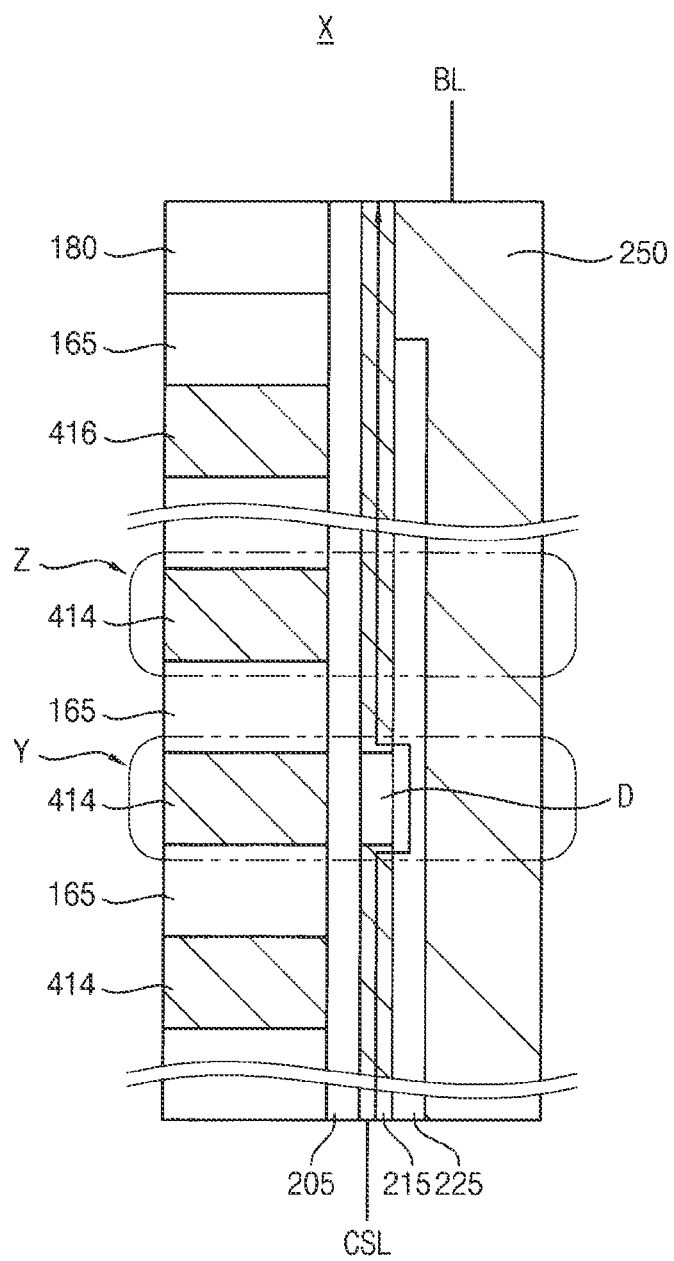
Figure 21:
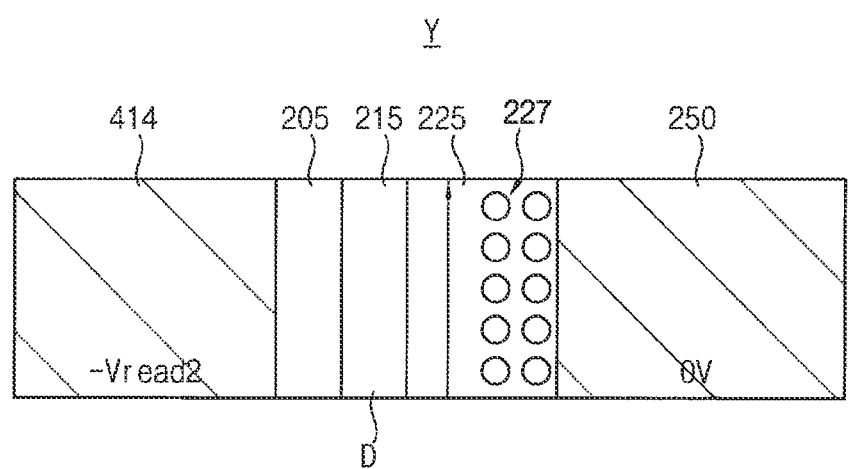
Figure 21:
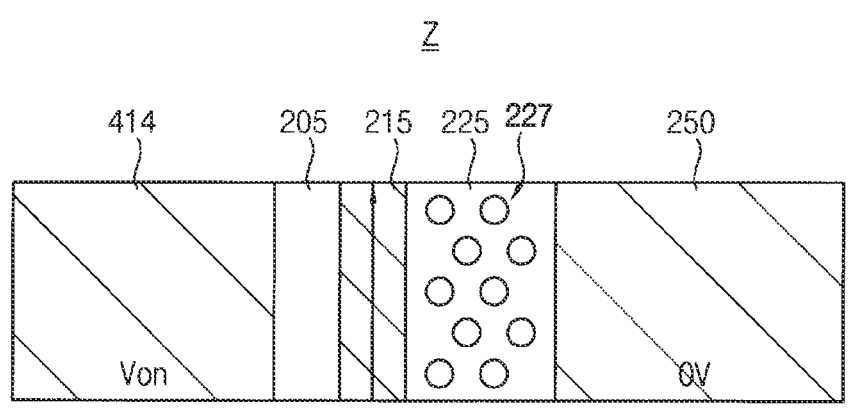
Figure 22:
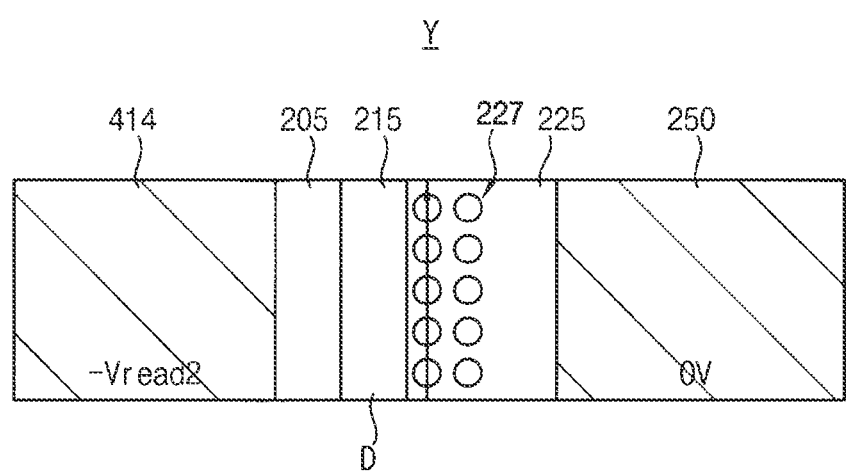
Figure 22:
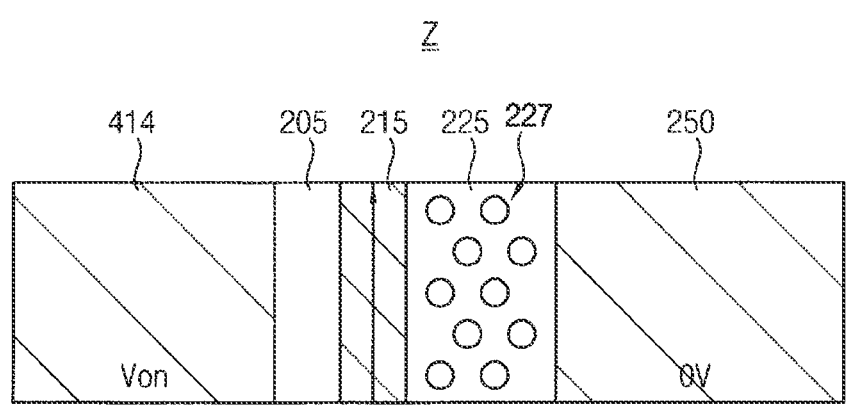

FIG. 20 illustrates region X of FIG. 1, FIG. 19 illustrates enlarged cross-sectional views of regions Y and Z of FIG. 11, and each of FIGS. 21 and 22 illustrates enlarged cross-sectional views of regions Y and Z of FIG. 20, in accordance with exemplary embodiments. Word lines shown in the regions Y and Z, respectively, may be word lines of a selected word line Sel WL and an unselected word line Unsel WL, respectively.

Referring to FIGS. 11, 18 and 19, 0 V may be applied to both the bit line BL and the common source line CSL, and 0 V and a second read voltage −Vread2 may be applied to the unselected word line Unsel WL and the selected word line Sel WL, respectively, in the cell string. Thus, 0 V may also be applied to the vertical gate electrode 250 electrically connected to the bit line BL.

The bit line BL and the common source line CSL electrically connected to opposite ends, respectively, of the channel 215 have the same electric potential, and thus, in an exemplary embodiment, a vertical current flowing through the channel 215 is not generated. However, a depletion region D may be formed at a portion of the channel 215 between the selected word line Sel WL and the vertical gate electrode 250 by a difference between the second read voltage −Vread2 and 0 V. Additionally, there is no electric potential difference between the unselected word line Unsel WL and the vertical gate electrode 250, and thus, in an exemplary embodiment, an inversion layer is not formed at a portion of the channel 215 therebetween.

If the reset operation has previously been performed, the oxygen vacancies 227 have been arranged in the vertical direction at a portion of the variable resistance pattern 225 distal to the channel 215 between the selected word line Sel WL and the vertical gate electrode 250 facing each other.

Referring to FIGS. 18, 20 and 21, with both the bit line BL and the vertical gate electrode 250 electrically connected to the bit line BL being maintained at 0 V, a first read voltage Vread1 may be applied to the common source line CSL at a sixth time t6, and may be maintained until a seventh time t7.

The unselected word line Unsel WL may be maintained at a turn-on voltage Von until the seventh time t7, and thus, an inversion layer may be formed by the difference between the turn-on voltage Von and 0 V. The selected word line Sel WL may be maintained at the second read voltage −Vread2 until the seventh time t7, and thus, the depletion region D at the portion of the channel 215 between the selected word line Sel WL and the vertical gate electrode 250 facing each other in the horizontal direction may also remain.

Accordingly, a read current may flow in the vertical direction upwardly through the inversion layer in the channel 215 by the difference between the first read voltage Vread1 and 0 V of the common source line CSL and the bit line BL, respectively. However, the depletion region D has been formed in the portion of the channel 215 adjacent to the selected word line Sel WL, and thus, the read current may flow through a portion of the variable resistance pattern 225 adjacent to the depletion region D. The oxygen vacancies 227 have been arranged at a portion of the variable resistance pattern 225 distal to the channel 215, and thus, a portion of the variable resistance pattern 225 through which the read current flows may have a high voltage. As a result, the read current may have a relatively low value, which may show that the memory cell is in a reset state.

Alternatively, referring to FIG. 22, the oxygen vacancies 227 may be arranged in a portion of the variable resistance pattern 225 adjacent to the channel 215 between the selected word line Sel WL and the vertical gate electrode 250 facing each other in the horizontal direction.

In this case, a portion of the variable resistance pattern 225 through which the read current flows, that is, the portion of the variable resistance pattern 225 adjacent to the channel 215, may have a low voltage. As a result, the read current may have a relatively high value, which may show that the memory cell is in a set state.

As illustrated above, each of the reset and set operations in the vertical variable resistance memory device may be performed by forming the depletion region D between the selected word line Sel WL and the vertical gate electrode 250 facing each other in the horizontal direction by using the electric potential difference therebetween, and moving the oxygen vacancies 227 arranged in the variable resistance pattern 225 in the horizontal direction.

On the other hand, the read operation in the vertical variable resistance memory device may be performed by using the read current flowing through the channel 215 by the electric potential difference between the bit line BL and the common source line (CSL) electrically connected to upper and lower ends, respectively, of the channel 215. However, the depletion region D may be formed at a portion of the channel 215 adjacent to the selected word line Sel WL, and thus, the read current may pass through an interface between the portions of the variable resistance pattern 225 and the channel 215, which may be disposed between the selected word line Sel WL and the vertical gate electrode 250. Thus, the read current may have a low value or high value depending on the position of distribution of the oxygen vacancies 227 in the variable resistance pattern 225, for example, at a portion proximate or distal to the channel 215, and the set state and the reset state of the variable resistance pattern 225 may be detected by the difference of the read current.

Accordingly, in the vertical variable resistance memory device, the reset and set operations may be performed by using the electric potential difference in the horizontal direction, and thus, the direction of the reset current and the set current may be substantially perpendicular to the direction of the read current. Referring to a comparative example, if both the direction of the reset current and the set current and the direction of the read current are the vertical direction, to prevent interference from occurring with relation to the reset state or the set state by the read operation, the reset current and the set current may be set to be greater than the read current. However, in exemplary embodiments, the read current may be substantially perpendicular to the direction of the reset current and the set current, and thus, the reset state or the set state may not be interfered with by the read operation regardless of the value of the read current. Accordingly, the reset current and the set current may have a low value regardless of the read current according to exemplary embodiments.

As a result, according to exemplary embodiments, the vertical variable resistance memory device may operate without utilizing a high operation current, and thus, deterioration of the memory cells and high power consumption may be prevented or reduced.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of performing a reset operation in a vertical variable resistance memory device comprising a cell string having memory cells disposed in series between a common source line (CSL) and a bit line (BL), wherein the cell string comprises:
　a plurality of word lines spaced apart from one another in a vertical direction;
　a vertical gate electrode extending in the vertical direction through the word lines and being insulated from the word lines; and
　a channel and a variable resistance pattern disposed between the vertical gate electrode and the word lines, each of the channel and the variable resistance pattern extending in the vertical direction, wherein the vertical gate electrode and an upper end portion of the channel contact each other and are electrically connected to the BL, and a lower end portion of the channel is electrically connected to the CSL, wherein each of the memory cells comprises each of the word lines, a portion of the vertical gate electrode facing a corresponding one of the word lines in a horizontal direction, and portions of the channel and the variable resistance pattern between each of the word lines and the portion of the vertical gate electrode facing each other in the horizontal direction, wherein the method comprises:
　applying a third reset voltage to a selected word line among the word lines and 0 V to the vertical gate electrode to form a depletion region at a portion of the channel of a selected memory cell among the memory cells, wherein the selected memory cell comprises the selected word line;

applying a first reset voltage to the vertical gate electrode while maintaining the selected word line at the third reset voltage, wherein the depletion region remains at the portion of the channel of the selected memory cell and oxygen vacancies distributed in a portion of the variable resistance pattern of the selected memory cell move in the horizontal direction to a portion of the variable resistance pattern distal to the channel; and applying a second reset voltage to the selected word line with the vertical gate electrode at the first reset voltage, wherein the oxygen vacancies distributed in the portion of the variable resistance pattern distal to the channel are arranged in the vertical direction and the selected memory cell is reset.

2. The method of claim 1, wherein the third reset voltage has a negative value, the first reset voltage has a negative value of which an absolute value is greater than that of the third reset voltage, and the second reset voltage has a negative value of which an absolute value is less than that of the third reset voltage.

3. The method of claim 2, wherein a turn-on voltage having a positive value is applied to an unselected word line among the word lines, and an inversion layer is formed at a portion of the channel of an unselected memory cell comprising the unselected word line.

4. The method of claim 3, wherein the oxygen vacancies are uniformly distributed in a portion of the variable resistance pattern of the unselected memory cell.

5. The method of claim 1, wherein
0 V is applied to both the CSL and the BL when the third reset voltage is applied to the selected word line,
the first reset voltage is applied to both the CSL and the BL when the first reset voltage is applied to the vertical gate electrode, and
the CSL and the BL remain at the first reset voltage when the second reset voltage is applied to the selected word line.

6. A method of performing a set operation in a vertical variable resistance memory device comprising a cell string having memory cells disposed in series between a common source line (CSL) and a bit line (BL),
wherein the cell string comprises:
a plurality of word lines spaced apart from one another in a vertical direction;
a vertical gate electrode extending in the vertical direction through the word lines and being insulated from the word lines; and
a channel and a variable resistance pattern disposed between the vertical gate electrode and the word lines, each of the channel and the variable resistance pattern extending in the vertical direction,
wherein the vertical gate electrode and an upper end portion of the channel contact each other and are electrically connected to the BL, and a lower end portion of the channel is electrically connected to the CSL,
wherein each of the memory cells comprises each of the word lines, a portion of the vertical gate electrode facing a corresponding one of the word lines in a horizontal direction, and portions of the channel and the variable resistance pattern between each of the word lines and the portion of the vertical gate electrode facing each other in the horizontal direction,
wherein the method comprises:

applying a third set voltage to a selected word line among the word lines and 0 V to the vertical gate electrode to form a depletion region at a portion of the channel of a selected memory cell among the memory cells, the selected memory cell comprising the selected word line; and applying first and second set voltages to the vertical gate electrode and the selected word line, respectively, wherein oxygen vacancies distributed in a portion of the variable resistance pattern of the selected memory cell move in the horizontal direction to a portion of the variable resistance pattern proximate to the channel to be arranged in the vertical direction.

7. The method of claim 6, wherein the third set voltage has a negative value, the first set voltage has a positive value, and the second set voltage has a negative value of which an absolute value is greater than that of the third set voltage.

8. The method of claim 7, wherein a turn-on voltage having a positive value is applied to an unselected word line among the word lines, and an inversion layer is formed at a portion of the channel of an unselected memory cell comprising the unselected word line.

9. The method of claim 8, wherein the oxygen vacancies are uniformly distributed in a portion of the variable resistance pattern of the unselected memory cell.

10. The method of claim 6, wherein
0 V is applied to both the CSL and the BL when the third set voltage is applied to the selected word line, and
the first set voltage is applied to both the CSL and the BL when the first and second set voltages are applied to the vertical gate electrode and the selected word line, respectively.

11. A method of operation in a vertical variable resistance memory device having memory cells disposed in a vertical direction, each of the memory cells comprising a word line, a vertical gate electrode facing the word line in a horizontal direction, and a channel and a variable resistance pattern between the word line and the vertical gate electrode facing each other,
wherein the method comprises:
moving oxygen vacancies in the variable resistance pattern included in a selected memory cell among the memory cells in the horizontal direction to a portion of the variable resistance pattern proximate or distal to the channel to cause the selected memory cell to be set or reset, respectively, wherein the oxygen vacancies are moved due to an electric field in the horizontal direction generated by an electric potential difference between the word line included in the selected memory cell and the vertical gate electrode; and
determining a state of the selected memory cell by flowing a read current in the vertical direction through the variable resistance pattern included in the selected memory cell, the state comprising a set state and a reset state.

12. The method of claim 11, wherein the read current flows in the vertical direction through a portion of the variable resistance pattern proximate to the channel included in the selected memory cell, wherein the read current when the selected memory cell is set is greater than the read current when the selected memory cell is reset.

13. The method of claim 11, wherein a depletion region is formed at the channel included in the selected memory cell by the electric field in the horizontal direction, and the read current flows through the variable resistance pattern and not through the channel.

14. The method of claim 13, wherein an inversion layer is formed in the channel included in an unselected memory cell among the memory cells by an electric field difference in the horizontal direction between the word line included in the unselected memory cell and the vertical gate electrode.

15. The method of claim 14, wherein the read current flows through the channel having the inversion layer included in the unselected memory cell.

* * * * *